(12) United States Patent
Nagarajan et al.

(10) Patent No.: US 7,326,629 B2
(45) Date of Patent: Feb. 5, 2008

(54) METHOD OF STACKING THIN SUBSTRATES BY TRANSFER BONDING

(75) Inventors: Ranganathan Nagarajan, Singapore (SG); Chirayarikathuveedu Premachandran Sankarapillai, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 388 days.

(21) Appl. No.: 11/169,907

(22) Filed: Jun. 29, 2005

(65) Prior Publication Data

US 2006/0057836 A1    Mar. 16, 2006

Related U.S. Application Data

(60) Provisional application No. 60/609,131, filed on Sep. 10, 2004.

(51) Int. Cl.
  *H01L 21/46* (2006.01)
(52) U.S. Cl. .......................... 438/459; 438/458
(58) Field of Classification Search ................ 438/455, 438/458, 459, 462, 464
  See application file for complete search history.

(56) References Cited

U.S. PATENT DOCUMENTS

| | | | |
|---|---|---|---|
| 5,426,072 A | 6/1995 | Finnila | 437/208 |
| 5,793,115 A | 8/1998 | Zavracky et al. | 257/777 |
| 6,319,831 B1 | 11/2001 | Tsai et al. | 438/678 |
| 6,521,530 B2 * | 2/2003 | Peters et al. | 438/458 |

(Continued)

OTHER PUBLICATIONS

Niklaus, et al., "Low Temperature Wafer-Level Transfer Bonding," Jrnl. of Microelectromech. Sys., vol. 10, No. 4, Dec. 2001, pp. 525-531.

(Continued)

*Primary Examiner*—Kevin M. Picardat
(74) *Attorney, Agent, or Firm*—Saile Ackerman LLC; Stephen B. Ackerman

(57) ABSTRACT

This invention describes a method of stacking, bonding, and electrically interconnecting a plurality of thin integrated circuit wafers to form an interconnected stack of integrated circuit layers. The first integrated circuit layer is formed by conventional processing on a silicon wafer to the stage where bond pads are patterned on a wiring layer interconnecting the subjacent semiconductive devices. The remaining integrated circuit layers are formed by first processing a standard wafer to form integrated circuit devices and wiring levels up to but not including bond pads. Each of these wafers is mounted onto a handler wafer by its upper face with a sacrificial bonding agent. The wafer is thinned, permanently fastened to the top surface of the first base wafer by a non-conductive adhesive applied to the thinned under face, and dismounted from the handler. Vertical openings are etched through the thinned layer to the bond pads on the subjacent wafer. Robust conductive pass-through plugs with integrated upper bond pads are formed in the openings. Additional thinned integrated circuit layers may be prepared, thinned, cemented onto the stack. Wiring interconnections can be made between any two or more layers. The process is unique in that it can be used to further stack and interconnect any number of thinned wafer layers to form a three dimensional integrated circuits, including MEMS devices. This approach provides a low temperature wafer bonding method using an adhesive which results in process simplicity and cost effectiveness by eliminating an additional masking and patterning process for under bump metal thereby enabling standard wafers to be integrated into a 3D stack with existing wire bonded wafers.

41 Claims, 16 Drawing Sheets

U.S. PATENT DOCUMENTS

| | | | |
|---|---|---|---|
| 6,586,843 B2 | 7/2003 | Sterrett et al. | 257/778 |
| 6,666,943 B2 | 12/2003 | Wada et al. | 156/230 |
| 6,964,881 B2 * | 11/2005 | Chua et al. | 438/459 |
| 7,078,266 B2 * | 7/2006 | Wood et al. | 438/459 |
| 7,118,989 B2 * | 10/2006 | Ramanathan et al. | 438/455 |
| 7,192,807 B1 * | 3/2007 | Huemoeller et al. | 438/118 |
| 2002/0106867 A1 | 8/2002 | Yang et al. | 438/458 |
| 2003/0232486 A1 * | 12/2003 | Mashino | 438/455 |
| 2004/0063322 A1 | 4/2004 | Yang | 438/689 |

OTHER PUBLICATIONS

Dekker, et al., "Substrate Transfer: Enabling Technology for RF Applications," IEDM 2003.

Glinge et al., "Silicon Layer Transfer Using Wafer Bonding and Debonding," Jrnl. of Elec. Materials, vol. 30, No. 7, 2001, pp. 841-844.

* cited by examiner

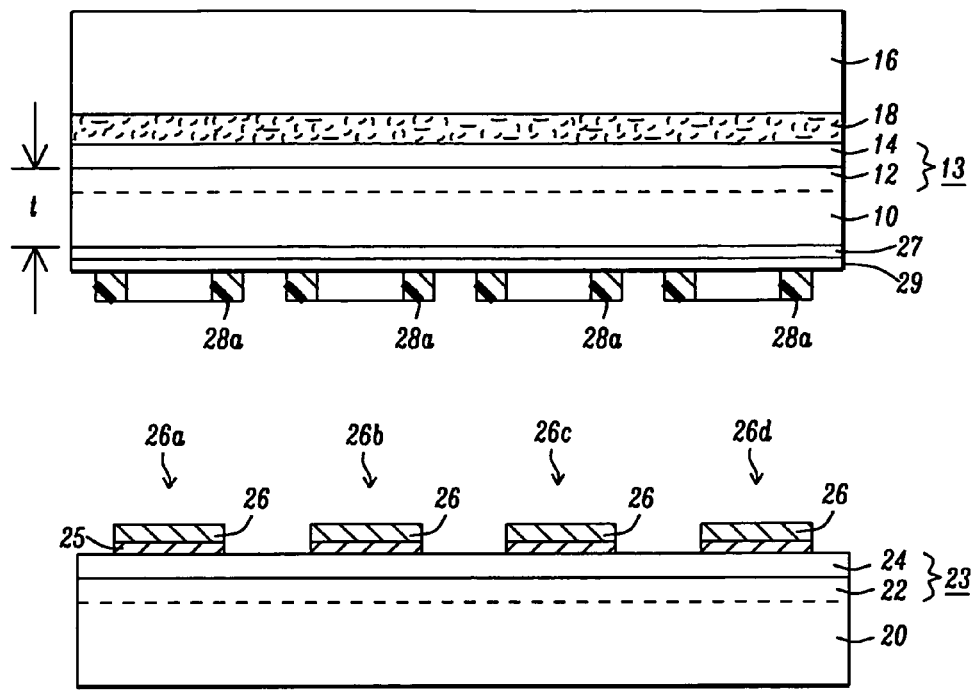
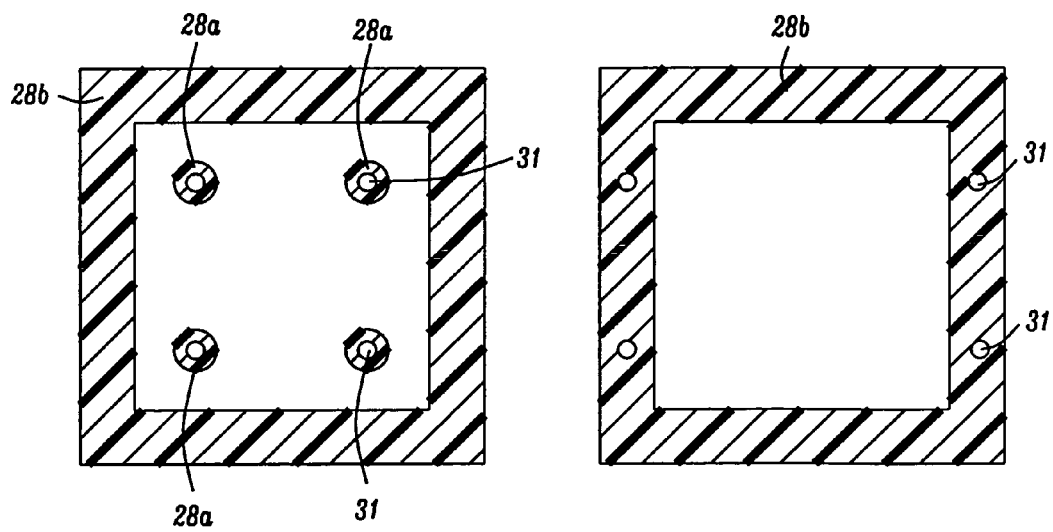
FIG. 3
FIG. 4a   FIG. 4b

METHOD OF STACKING THIN SUBSTRATES BY TRANSFER BONDING

This application claims priority to U.S. Provisional Patent Application Ser. No. 60/609,131, filed on Sep. 10, 2004, which is herein incorporated by reference in its entirety.

BACKGROUND OF THE INVENTION (1) Field of the Invention

The invention relates to processes for the manufacture of integrated circuits and more particularly to the area of forming three-dimensional integrated circuits by wafer stacking.

(2) Background of the Invention and Description of Previous Art

In the apparent never ending quest towards further miniaturization and increasing circuit density of solid state integrated circuits, the technology has been forced to develop new packaging approaches, other than discrete single surface silicon chips. One such approach involves packaging integrated circuits using multiple chips layered and interconnected one upon the other. Although the concept of multilayered chips is old, the technology to produce them cost effectively was not available. Such processes as SOI (Silicon On Insulator) and SOS (Silicon On Sapphire) as well a the bonding of discrete devices, such as MEMS (Micro-Electro-Mechanical-Systems) onto integrated circuit chips were well known but not cost or design effective. In recent years however, with the development of high precision wafer thinning methods such as CMP (Chemical Mechanical Polishing) and DRIE (Deep Reactive Ion Etching) in conjunction with improved bonding methods and materials such as fine adhesives, multiple chip stacking has become increasingly desirable as well as practical. In addition, these improvements have also allowed the formation of items, which were previously impossible because of processing incompatibilities. Wada, et al, U.S. Pat. No. 6,666,943, describes a process of transferring a film which has been annealed at a high temperature on a first substrate, onto a second substrate which could not have endured such an anneal if the film were deposited directly on it. The process is only capable of transferring deposited films from one substrate to another and the separation requires a lift-off process.

Yang, et al, U.S. Patent Application number 2002/0106867 A1 describes a method for transferring a membrane from one wafer to another wafer to form integrated semiconductor devices wherein a carrier wafer is fabricated with a membrane on one surface. The membrane is then bonded to a device wafer by a plurality of joints. The joints and the device wafer are then isolated from exposure to etching chemicals and the carrier wafer is then selectively etched away from the back to expose the membrane and leave the membrane bonded to the device wafer. The method requires special tools to transfer the layers. RIE using a shadow mask, as applied by the reference to selectively remove peripheral portions of the carrier wafer, poses critical alignment problems. Further, the method is not suitable for wafer level post processing. In Yang, et al. U.S. Patent Application number 2004/0063322 A1, wet etching to remove the carrier wafer is replaced by gaseous etching and the surfaces of the device wafer are protected by an oxide layer.

Niklaus, et al. "*Low Temperature Wafer-Level Transfer Bonding*", Journal of Microelectromechanical Systems. Volume 10, No. 4, December 2001, pages 525-531 shows that by bonding a target wafer onto a base wafer by means of a BCB (benzocyclobutene) bonding process, it is possible to thin down the target wafer to a desired thickness by a grinding/etching process to reach an etch-stop layer. Dekker, et al. "*Substrate Transfer: Enabling Technology for RF Applications*", IEDM 2003, similarly shows that, by bonding a CMOS device wafer on SOI onto a glass substrate by means of a polymer glue layer and thinning, it is possible to achieve high Q RF systems. None of these approaches, however, are suitable for thicker substrate transfer for MEMS or Wafer level packaging applications.

Zavracky, et al, U.S. Pat. No. 5,793,115 cites a method of integrating a three dimensional processor using transferred thin film circuits. It describes specifically, how a microprocessor may be configured with different layers and interconnected vertically through insulating layers, which separate each circuit layer of the structure. Each circuit layer can be fabricated on a separate wafer or thin film material and then transferred onto the layered structure and interconnected. The reference only describes a 3D-system design or architecture and does not relate how the 3D-wafer stack is formed. Colinge, et al. "*Silicon Layer Transfer Using Wafer Bonding and Debonding*", Journal of Electronic Materials, Volume 30, No. 7, 2001, pages 841-844 describes a method of separating and transferring thin silicon layers from a base wafer by a hydrogen implanted Ion-cut method.

Sterrett, U.S. Pat. No. 6,586,843 B2 cites a method for bonding and interconnecting a flip-chip die onto a substrate using a partially cured BCB as a bonding adhesive and as a connection bump. Finnila, U.S. Pat. No. 5,426,072 cites a process for manufacturing a three dimensional integrated circuit using stacked thin silicon layers formed from SOI substrate wafers. Integrated circuits are first formed on the thin silicon layer of an SOI wafer. Indium bumps are formed on the upper surface of the integrated circuit and conductive feed-throughs are formed extending to the subjacent sacrificial oxide layer. A carrier wafer is then bonded on top of the passivated integrated circuit and the SOI substrate and sacrificial oxide are removed. Metallization and indium bumps are then formed on the now exposed bottom of the thin silicon layer, connecting to the feed-throughs. The thin silicon layer is then bonded, either to a final base substrate or to a previously formed thin silicon layer. The carrier wafer is then removed. Additional thin silicon layers may be formed on other SOI wafers, prepared in a similar way, and successively bonded to the first thin silicon layer to form a stack. The method requires bumps and UBM (Under Bump Metallization) at each layer, which adds to the process complexity as well as cost. In addition, through wafer metallization is formed in two stages, both prior to final bonding to the permanent substrate, thereby requiring additional processing steps.

Tsai, et al., U.S. Pat. No. 6,319,831 cites a two-stage method of ECD which includes a first low current density plating stage wherein the copper deposition is slow but highly conformal. In the second, high current density stage, the brighteners and levelers in the plating bath are depleted which enhances the growth rate of copper at the base of the opening, thereby inhibiting void formation.

SUMMARY OF THE INVENTION

It is an object of this invention to provide a method for stacking and interconnecting integrated circuit device wafers by transfer bonding thin wafer/substrate layers.

It is another object of this invention to provide a method for stacking and interconnecting multiple transfer bonded thin device wafer layers whereby devices and circuits on any one layer may be connected to devices or circuits on any other layer.

It is yet another object of this invention to describe a method for forming robust wafer pass-through conductive elements with integral bond pad or upper surface connective link terminations.

It is yet another object of this invention to describe a method for stacking and interconnecting multiple thin integrated circuit device wafers with robust conductive wafer pass-through elements and interfacial conductive wiring link connections.

These objects are accomplished by bonding the top device surface of a first silicon device wafer to a handler wafer with an easily removable sacrificial bonding layer. After bonding, the first silicon device wafer is thinned by removal of silicon on the unbonded side. The exposed silicon underside is coated with an insulative layer, for example silicon oxide, and a non-conductive barrier layer, for example silicon nitride. An adhesive layer, which can be an inorganic, organic or metal layer is then coated on the barrier layer on the underside of the now-thinned first silicon device wafer. The adhesive layer is patterned photolithographically, or by any other means of patterning such as imprinting, screen printing, dry-film patterning, or etching to form a pattern of adhesive which mates the bond pad patterns on the surface of a second semiconductor integrated circuit wafer and also forms a protective seal ring around the device and bond pad area.

The second semiconductor integrated circuit wafer contains integrated circuits, patterned as dice and wiring which terminates at bond pads exposed on the top surface. After patterning the adhesive layer on the first device wafer, the two wafers are pressed together and securely bonded by fully curing the patterned adhesive. The first wafer is then released from the handler wafer by detaching from the bonding layer or sacrificially removing the bonding layer. Alternatively, a non-processed wafer can be directly bonded to an integrated circuit wafer by means of a patterned adhesive layer and then thinned down to the required thickness. After thinning, integrated circuits can be formed in the thinned surface.

Through-holes are etched through the thinned first wafer in regions where the interconnections are to be made from the second wafer. The through-holes expose the bonding pads of the second wafer. In addition, access openings are formed to wiring levels in the first wafer that are to be interconnected to bonding pads on the second wafer or to initiate bonding interconnections to circuits on any to-be-added upper integrated circuit device layers. A blanket conformal insulative layer is deposited over the entire wafer lining the through-holes and access openings to thereby isolate the interconnections from the silicon substrate. Anisotropic etching of the insulative layer then exposes the bond pads of the second wafer and leaves insulative sidewalls within the openings. While anisotropically etching the insulative layer the adhesive bonding layer can also be etched. This may not be necessary if the adhesive layer on the bond pad is already patterned in an earlier processing step. A conformal barrier layer is formed in the openings and on the wafer surface and the through holes are then filled with a conductive material, such as electrodeposited copper, thereby forming accessible connections to the circuits in the subjacent second wafer. The copper thus formed is subsequently planarized by chemical mechanical polishing (CMP) process. It should be noted that the CMP process removes the entire surface copper and subjacent barrier layer that lies outside the via regions.

A second barrier layer and an insulative shield/passivation layer is deposited on the thinned first wafer and the layers are patterned to form contact windows and conductive links by conventional metallization and patterning process or by a damascene process, thereby making any interconnections between the circuits on the first and second wafers. Another layer of protective barrier and an insulative shield/passivation layer is deposited and patterned to form final bond pad openings. The process can then be repeated by placing a third device wafer onto a handler wafer, repeating the above processing steps, bonding the third wafer onto the second bond pads and again forming pass through connections. In this manner, multiple layers of integrated circuits can be stacked and robustly and reliably interconnected.

It is another object of this invention to provide a method for stacking and interconnecting integrated circuit device wafers by transfer bonding while concurrently forming sidewall protected trenches over wafer dicing lines.

It is yet another object of this invention to provide a method for hermetically sealing porous bonding adhesive edges along the diced perimeter of transfer bonded multilayer integrated circuit chips.

These objects are accomplished by anisotropically etching trenches over dicing lines after interconnect conductive pass throughs have been formed in each thinned layer. The trenches are etched entirely through the thinned layer, through the bonding adhesive, and into the subjacent layer. The dicing trenches are etched in each layer after the conductive pass-throughs for that layer have been formed. Thus, after each layer, the dicing trench for that layer joins the trench of the subjacent layer. When the final layer of the stack has been completed, and the final trench therein is formed, the dicing trenches extend all the way from the top of the stack to within the base wafer. Next protective sidewalls are formed in the deep dicing trenches thereby, forming a hermetic seal over each of the exposed edges of the porous bonding adhesive. The protective sidewalls are formed by depositing a pore-sealing layer like silicon nitride, silicon carbide, titanium, tantalum, or oxides thereof. The as-deposited pore-sealing layer is etched back to leave a pore sealing sidewall spacer in the trench. The remaining silicon beneath the trenches is then removed, preferably with a dicing saw to singulate the dice. The sidewall spacer seals the polymeric adhesive edge from environment. This embodiment applies especially to MEMS wafer level packages that typically require a hermetic seal.

It may be noted that the protective seal ring can further be a hermetic or non-hermetic seal depending on the type of bonding material used. If the bonding layer is a porous material like BCB or any other polymer, further treatment becomes necessary to seal the pores of the bonding layer.

BRIEF DESCRIPTION OF THE DRAWINGS

FIGS. 1 through 3, 5, 6a, 6b, 7 through 10, 11a, 11b, 12, and 13 are cross sections of portions of semiconductor wafers showing a sequence of process steps for forming a multilayer stack of thin integrated circuit wafers according to the process of a first embodiment of this invention.

FIG. 4a and FIG. 4b are planar views of adhesive layer patterns used to bond successive thin integrated circuit layers together according to the embodiment of this invention. The patterns shown in the figures are lithographically defined after deposition of the adhesive.

DESCRIPTION OF THE PREFERRED EMBODIMENTS

First Embodiment

In a first embodiment of this invention a stack of three interconnected integrated circuit layers is formed consisting of two thin silicon integrated circuit layers formed on a third integrated circuit layer, the later being formed on a conventional silicon wafer substrate. The embodiment illustrates not only the method forming and transfer bonding of multiple thin semiconductor device layers to create three dimensional integrated circuit chips but also the application of the method to interconnect devices on adjacent layers, non-adjacent layers, and multiple layers.

Formation of a First and Second Integrated Circuit layers

Figure 1:
Figure 2:
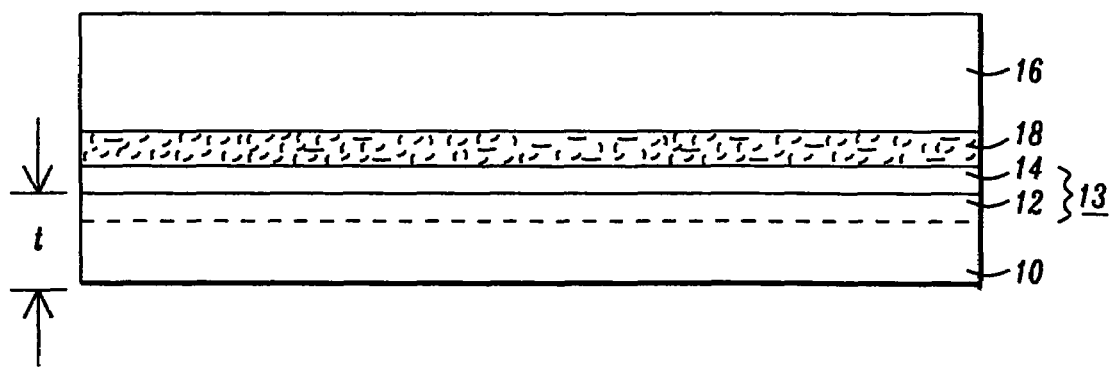

Referring to FIG. 1, a first silicon wafer 10 is prepared by conventional processing. Semiconductive devices are formed within the top surface 12 of the wafer 10 and a personalization layer 14 consisting of a plurality of wiring levels interleaved with ILD (interlevel dielectric) layers and interconnected with conductive contacts and vias are formed over the devices. The wiring levels terminate in conductive bond pads, which will later be exposed through patterned access openings in a final top blanket passivation layer. The top passivation layer (not shown separately) also protects the subjacent wiring layers from damage during subsequent wafer thinning. Together, the device layer 12 and the personalization layer 14, which includes a top passivation layer (not shown), are herein defined as a second integrated circuit layer 13 of the three layer integrated circuit stack. In the process of this invention the wafer 10 is next fastened securely, by its upper surface, onto a handler substrate 16 with an easily removable bonding material 18 such as a wax or a soluble bonding agent or resin (FIG. 2). The handler substrate 16 may consist of another silicon wafer or a manageable glass or sapphire plate. After mounting on the handler substrate 20, the first silicon wafer 10 is thinned to a thickness t of between about 2 and 300 μm., preferably by grinding and polishing the underside of the wafer 10. After thinning, an insulative layer 27, preferably silicon oxide between about 500 and 1000 nm thick and a barrier/passivation layer 29, preferably silicon nitride, between about 50 and 100 nm thick are sequentially deposited on the underside of the wafer 10. The layers 27 and 29 together form an insulative shield layer that insulates and protects the silicon underside of the thinned wafer. The layer 29 is optional and may be applied if additional moisture or copper diffusion protection is needed.

Referring to FIG. 3, a second silicon wafer 20, which will become the substrate or base of a to-be-formed integrated circuit layer stack, is processed like the first device wafer, forming devices (not shown) within its upper surface 22 and a personalization layer 24 consisting of a plurality of wiring levels interleaved with ILD layers and interconnected with conductive contacts and vias. The wiring levels terminate in conductive bond pads 26a, 26b, 26c, and 26d which are exposed through openings patterned in a top passivation layer (not shown). Together, the device layer 22 and the personalization layer 24 are herein referred to as the first integrated circuit layer 23. The local wiring can be made of standard Aluminum or Copper back-end of the line process technology. In either case, the final metallization step involves protective passivation layer deposition and bond pad window opening.

The bond pads 26a, 26b, 26c, and 26d are formed by first depositing a barrier layer 25 on the upper dielectric layer of the personalization level 24. The barrier layer 25 may comprise Ta, TaN, Ti, Ta/TaN, Ti/TiN, or any other conductive layer which will block the migration of copper depending on the type of metallization scheme. The barrier layer 25 is typically deposited by sputter deposition and is between about 25 and 100 nm thick. A blanket layer of copper 26, between about 100 and 1000 nm thick is then formed on the barrier layer 25, preferably by sputter deposition. Alternately, the layer 26 may be formed of aluminum since the bond pads formed thereof will be the most remote from the final electrical contact pads and therefore will have a negligible effect on the overall performance of the completed integrated circuit. A second barrier layer (not shown) comparable in thickness to the first 25 may be deposited on the top of the copper layer 26. If the layer 26 is aluminum, the second barrier layer may be omitted.

The stack of blanket layers 25 and 26 are then patterned, preferably by photolithographically, to define bond pads 26a, 26b, 26c, and 26d. Bond pads 26a and 26d will be used in this embodiment to form a direct conductive path from devices in the first, lowermost, device layer 22 to the top of the stack. Bond pad 26b will illustrate interconnection of circuits in the first device layer 22 and in those the second device layer 12 while bond pad 26c will show interconnection of devices in the first layer 22 and those in the third layer 64. Alternately, a damascene or dual damascene process may be used to form the bond pads 26a, 26b, 26c, and 26d. The bond pads 26a, 26b, 26c, and 26d are preferably formed as circular disks. However, they may alternately be rectangular.

An insulative glue layer 28, preferably BCB, is coated on the polished bottom surface of the now-thinned first silicon device wafer 10. BCB is available in several forms from the Dow Chemical Company under the trade name of Cyclotene. For the purpose of this invention, a Cyclotene 4000 series photo BCB resin is used. While a Cyclotene resin is illustrated here as the preferential adhesive, alternative adhesives, for example, frit glasses, low-k materials, ceramics, or epoxies may be used. After soft baking to drive out residual solvents and achieve dimensional stability the resin layer 28 is partially cured and then patterned preferably by photolithography to form rings 28a with openings which mate the device die bond pad pattern of the second silicon device wafer 20 whereby, when the second device wafer 20 is bonded to the first wafer 10, each bond pad 26a, 26b, 26c, and 26d is encircled with a ring of adhesive resin 28a. In addition a rectangular band of resin is patterned on the peripheral region of each die of the wafer. Planar views of two possible resin patterns are shown in FIG. 4. In FIG. 4a, a rectangular band 28b of adhesive is formed in the periphery of each die and a discrete ring of adhesive 28a encircles each of the bond pads 26a, 26b, 26c, and 26d which are located in the interior region of each die. The rectangular band 28b on each die not only provides an effective encapsulation of the die, but also substantially increases the bonding area, thereby improving the mechanical reliability of the structure. In FIG. 4b, the bond pads 26a, 26b, 26c, and 26d are located within a peripheral adhesive band of the die and are thereby automatically encircled with adhesive. A third alternative pattern would be a combination of first two. The diameters of the openings 31 are made slightly smaller than the diameters of the bond pads so that when the bond pads are subsequently pressed into the openings, the adjacent resin deforms to make a snug seal against the bond pads and leaving an air space between the top of the bond pads and the barrier layer 29 on the underside of the thinned wafer 10. In an alternative patterning process, the bond pads can be made rectangular and the resin patterns 28a would correspondingly also be patterned rectangular with inner openings slightly smaller than the bond pad dimensions.

Figure 5:
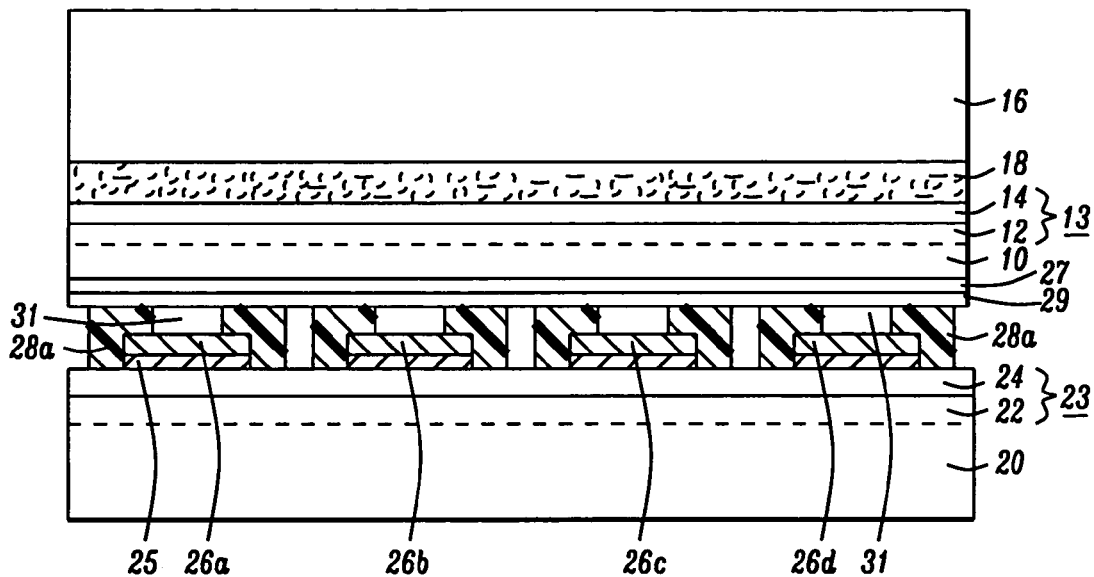

After patterning, the mounted top wafer 10 is positioned over the substrate wafer 20 so that the openings in the BCB pattern are aligned to the respective bond pads 26a, 26b, 26c, and 26d. Referring to FIG. 5, the bottom surface of the thinned wafer 12 is pressed onto the top surface of the base wafer 20 and the BCB features are fully cured by placing the assembly into an annealing oven at a temperature of between about 250 and 450° C. in an ambient of Nitrogen for a period of between about 30 and 120 minutes.

After bonding to the substrate wafer 20, the thinned wafer 10 is separated from the handler wafer/substrate 16 and now form becomes part of the second layer of the three layer interconnected integrated circuit stack 5. After cleaning any residual wax or other bonding material 18 from the surface of the thinned wafer 10, an insulative layer 30, preferably silicon oxide is deposited on the upper surface of the personalization layer 14 to a thickness of between about 3000 and 13,000 Å. Insulative layer 30 will be photolithographically patterned two successive times to form a shallow access opening to wiring in the personalization layer 14 and deep pass through openings to bond pads on the first integrated circuit level 23.

Figure 6A:
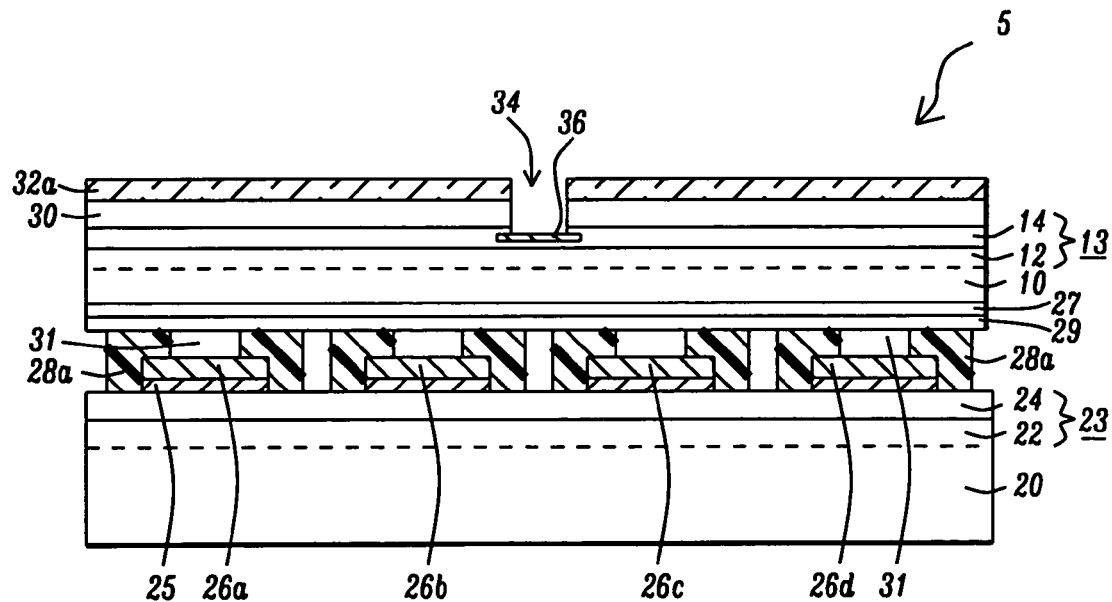

Referring now to FIG. 6a, a first photoresist layer 32a is deposited over the layer 30 and patterned to define an access opening 34 over a segment 35 of conductive wiring in an upper wiring layer within the personalization layer 14. The segment 35 is to be connected to wiring (not shown) in the personalization layer 24 of the subjacent first integrated circuit layer 23 through the bonding pad 26b. The opening 34 is then formed by anisotropically etching of the layer 30 and into the personalization layer 14 to expose the wiring segment 35. The width of the opening 34 is preferably between about 0.1 and 5 microns depending on design. The residual photoresist 32a is then removed, preferably by the use of a liquid stripper. Alternately, the photoresist may be removed by ashing in oxygen plasma.

Figure 6B:
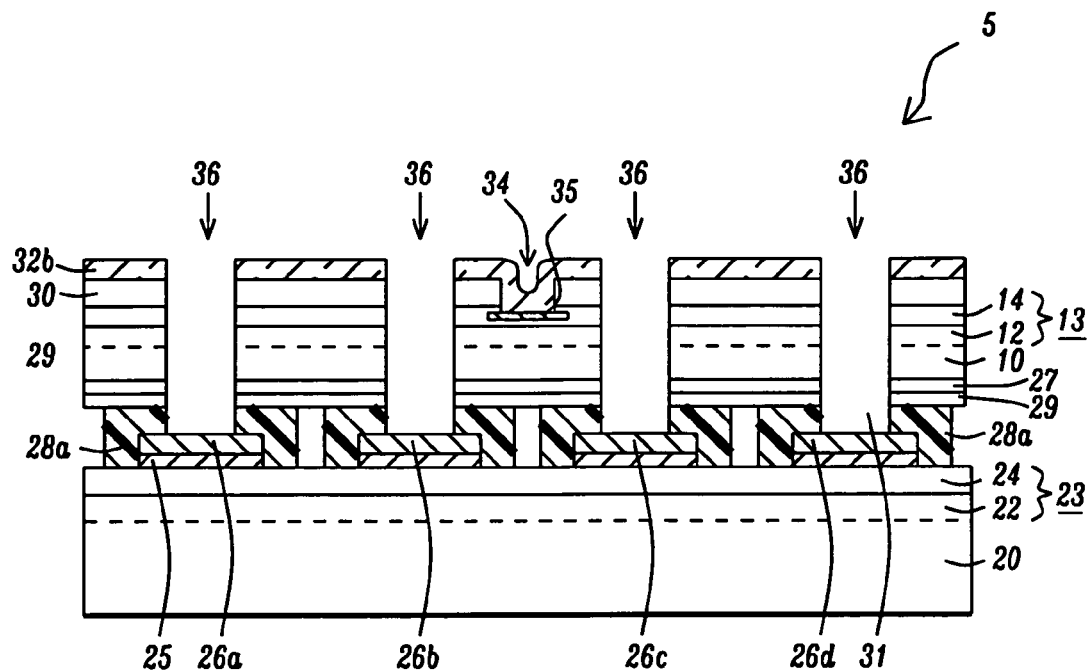

Referring now to FIG. 6b, a second photoresist layer 32b is deposited over the layer 30 and patterned to define pass-through openings 36 while covering the access opening 34. The pass through openings 36 are then etched anisotropically by RIE or plasma etching, first with an etchant containing fluorocarbons to penetrate the insulative layer 30 and the subjacent personalization layer 14 and then with an etchant containing halogens to penetrate the thinned silicon wafer 10, endpointing on the oxide layer 27 over each bond pad 26a, 26b, 26c, and 26d. The oxide layer 27 and the barrier layer 29 at the base of each opening 36 are then removed; preferably by an oxide RIE or plasma etch to expose the openings 31 and the subjacent bonding pads. The widths of the completed openings 36 are preferably between about 2 and 80 microns depending on the application, the metallurgy, and the thickness of the thinned device wafer 10.

Figure 7:
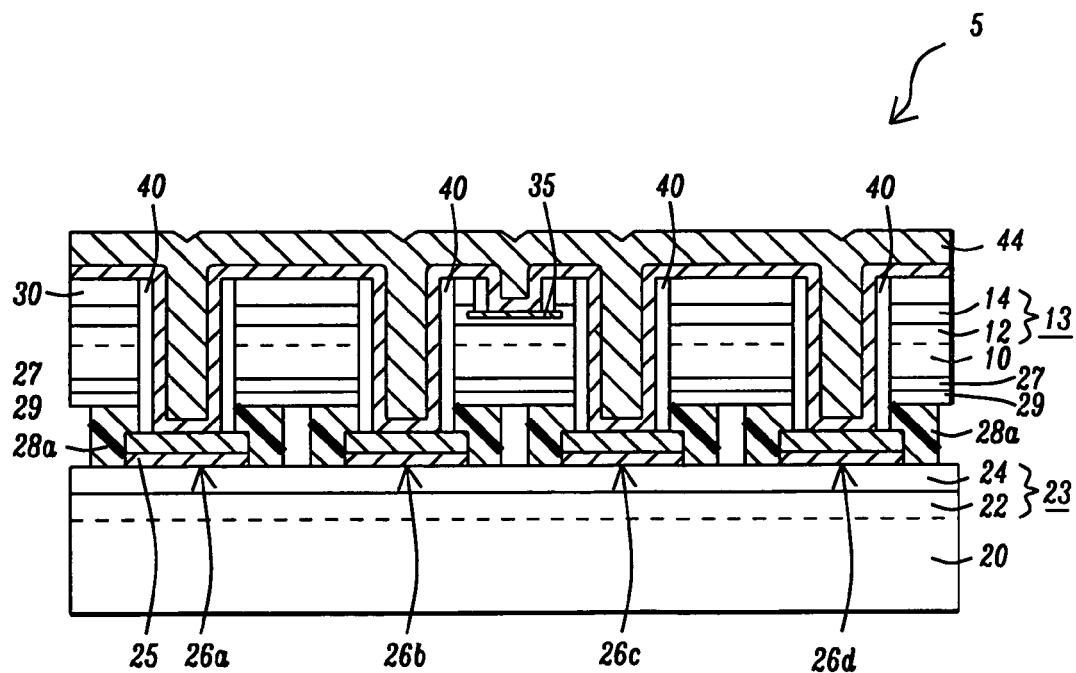

Referring next to FIG. 7, residual photoresist mask 32b is removed, preferably with a liquid stripper, and a conformal layer of a sidewall insulator, preferably silicon oxide is deposited, for example by PECVD (plasma enhanced CVD). After deposition, the oxide layer is anisotropically etched to expose the bond pads 26a, 26b, 26c, and 26d at the base of each opening 36 and the wiring pad 35 while leaving oxide sidewalls 40 within each deep opening 36 and, respectively, within the shallow opening 34. A barrier layer 42 is next conformally deposited, preferably by sputtering, to a thickness of between about 10 and 300 nm. The barrier layer 42 may comprise Ta, TaN, Ti, Ta/TaN, Ti/TiN, or any conductive layer which will block the migration of copper. A blanket seed layer (not shown), comprising a thin layer of copper or gold between about 500 and 3000 Å thick is next conformally deposited on the barrier layer 42, preferably by sputtering. A copper layer 44 is then deposited onto the seed layer preferably by ECD (electrochemical deposition), under conditions and procedures favoring uniform gap filling of high aspect ratio openings. These conditions and procedures include the use and control of brighteners and levelers in the plating bath as well as variation of plating rate by control of current density. The openings 34 and 36 are thereby filled leaving a blanket layer of copper on the upper surface the final thickness is dependent upon the widths of the openings 34 and 36. Alternately, the layer 44 may be formed to the desired thickness entirely by sputtering or it may be deposited by a CVD method. However, because of the high aspect ratio of the openings 39, these methods present greater risk of voids in the resultant copper through-hole via.

Figure 8:
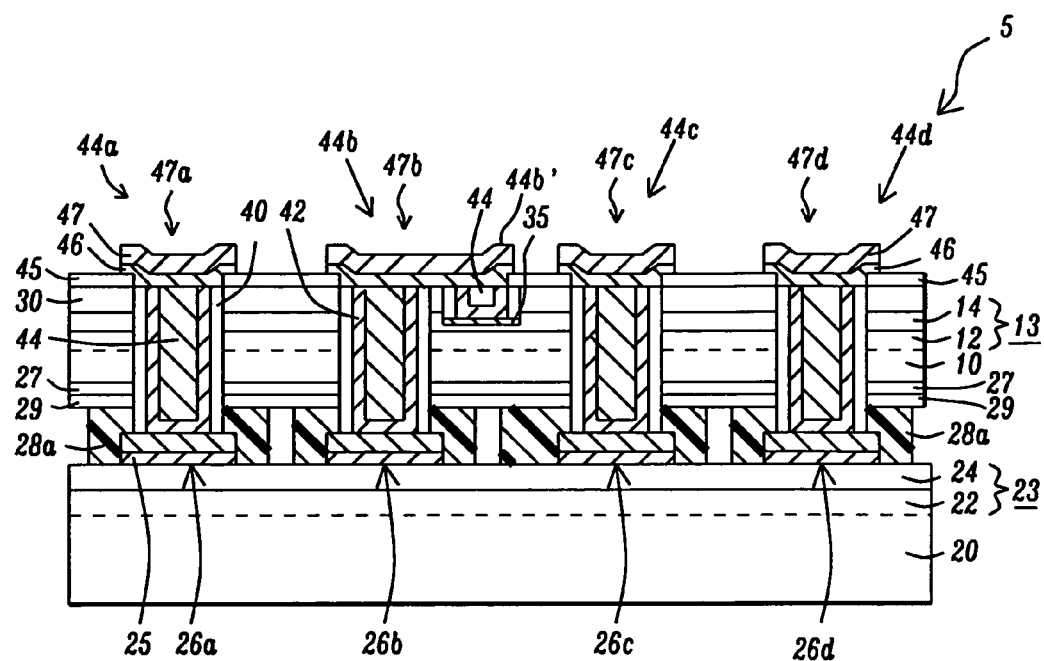

Referring now to FIG. 8, the top surface of the assembly 5 is planarized by CMP whereby the copper layer 44 is polished to a level to remove the uppermost planar portions of the barrier layer 42 to form and electrically isolate pass-through conductor elements 44a, 44b, 44c, and 44d, and the wiring stud 44b' which will next be connected to the element 44b to form a conductive interconnection between a circuit in second integrated circuit layer 13 and a circuit in the first integrated circuit layer 23. An over-etch period of the order of a few seconds to a minute is suggested to assure complete removal of any intervening conductive material.

An insulative cap layer 45 of silicon nitride or silicon carbide is deposited onto the layer 30 to provide a copper diffusion barrier as well as surface passivation. Access openings to the pass-through conductor elements 44a, 44b, 44c, and 44d are next patterned in cap layer 45 a blanket conductive barrier layer 46 is deposited over the assembly 5 preferably by sputtering, to a thickness of between about 10 and 300 nm. The barrier layer 46 may comprise Ta, TaN, Ti, Ta/TaN, Ti/TiN, or any similar conductive material, which will block the migration of copper. Next, a blanket conductive interconnect metal layer 47, for example aluminum or copper is sputtered onto the barrier layer 46 to a thickness of between about 0.5 and 1.0 microns. The combined layers 46 and 47 are then patterned to form bond pads 47a, 47c, 47d, and a bond pad/lateral wiring segment 47b, which completes an interconnection between circuitry in integrated circuit layer 13 and circuitry in integrated circuit layer 23. This completes the processing of the second integrated circuit layer. The stack assembly 5 is now ready for the placement of a third integrated circuit layer. Alternately, the interconnection can be formed by other known methods such as damascene or dual damascene processes as mentioned supra.

Formation of a Third Integrated Circuit Layer

Figure 9:
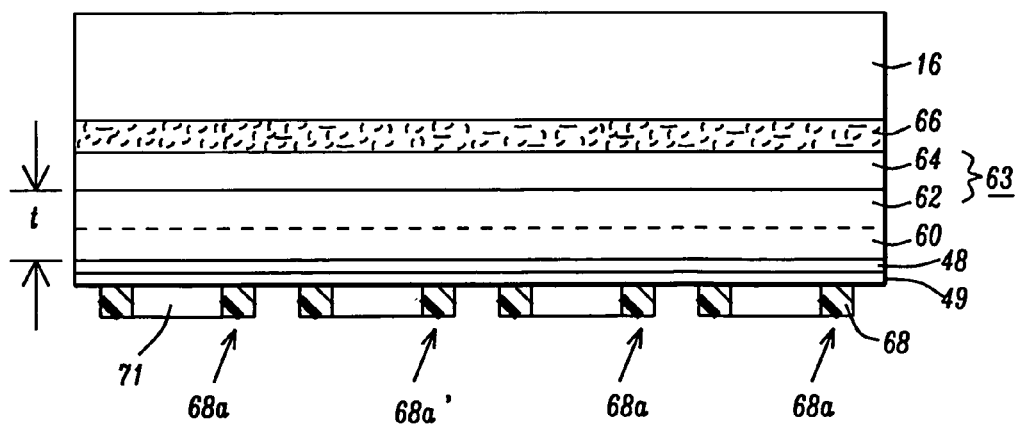

Referring to FIG. 9 a third silicon device wafer 60 is prepared by conventional processing. Semiconductive devices are formed within the top surface 62 of the wafer 60 and a personalization level 64 consisting of a plurality of wiring levels interleaved with ILD layers and interconnected with conductive contacts and vias is formed over the devices. The wiring levels terminate in conductive bond pads, which will later be patterned on a final top ILD layer. Together, the device layer 62 and the personalization level 64 are defined here as a third integrated circuit layer 63. Wafer 60 is fastened securely, by its upper surface, onto the handler substrate 16 with an easily removable bonding material 66 such as a wax or a soluble bonding agent or resin. The handler substrate 16 may consist of another silicon wafer or a manageable glass or sapphire plate. For convenience, the original handler substrate/wafer 16 may again be used. After mounting on the handler substrate 16, the third silicon device wafer 60 is thinned to a thickness t of between about 2 and 300 μm. preferably by CMP. After thinning, an insulative layer 48, preferably silicon oxide between about 500 and 1000 nm thick and a barrier/passivation layer 49, preferably silicon nitride between about 50 and 100 nm thick, are sequentially deposited on the underside of the wafer 60. The layer 49 is optional and may be applied if additional moisture or copper diffusion protection is needed.

An insulative glue layer 68, preferably BCB, is coated on the polished bottom surface of the now-thinned first silicon device wafer. After soft baking to drive out residual solvents and achieve dimensional stability the resin layer 68 is preferably patterned by photolithography to form rings 68a with openings 71 which mate the upper exposed portions of the bond-pads 47a, 47c, and 47d. Although in the present embodiment there is no pass-through conductor extending above the second integrated circuit layer, a resin ring 68a' is nevertheless also included. The inclusion of this dummy resin ring permits the use of the same photomask used to define the first level resin rings 28a. In addition the dummy pad 68a' provides an additional bonding element to the structure. The resin pattern is modeled after the resin patterns shown in FIG. 4, and includes a rectangular resin band (not shown) in the periphery of each die.

Figure 10:
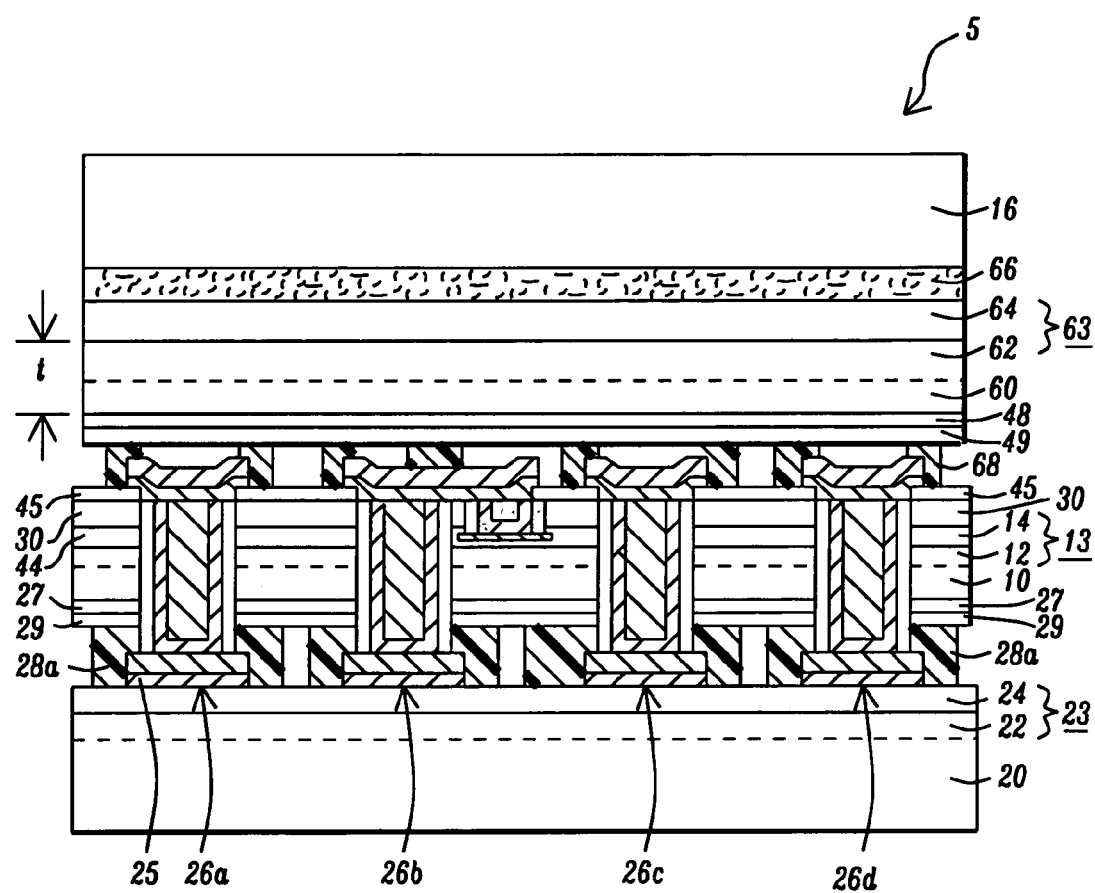

After patterning, the resin 68 is partially cured and the handler mounted wafer 60 is positioned over the substrate wafer 20 and aligned so that ring openings in the BCB pattern 68a are aligned to the respective bond-pads 47a, 47c, and 47d, on top of the second integrated circuit layer 13 Referring to FIG. 10, the bottom surface of the thinned wafer 60 is pressed onto the top surface of the second integrated circuit layer 13 and the BCB features are fully cured by placing the assembly into an annealing oven at a temperature of between about 250 and 450° C. in an ambient of Nitrogen for a period of between about 30 and 120 minutes.

Figure 11A:
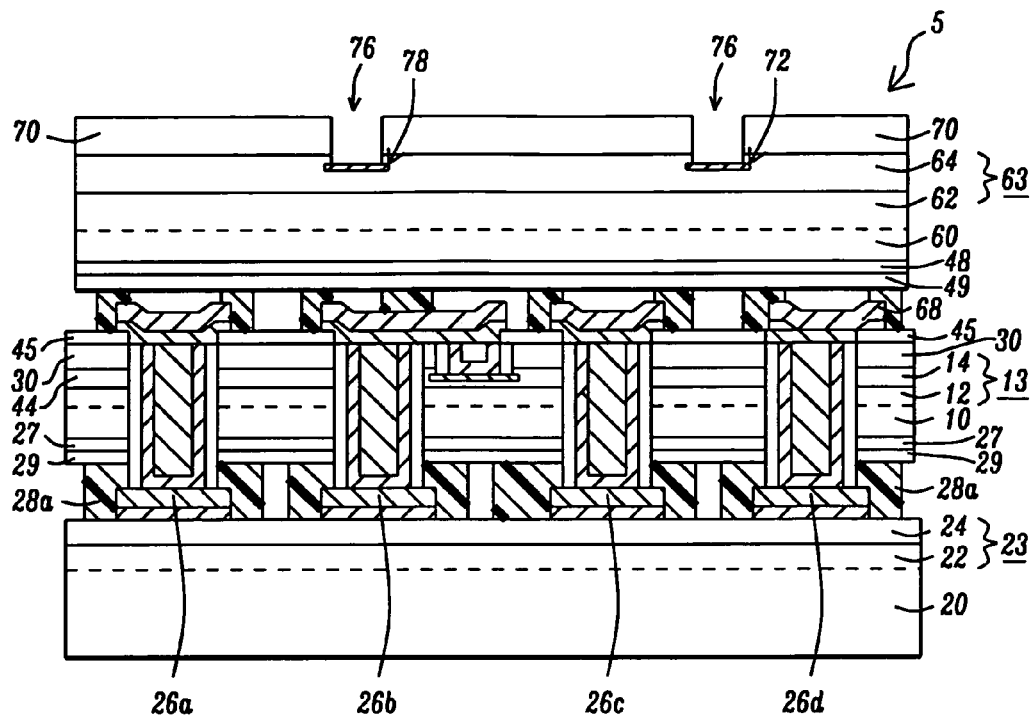

Referring now to FIG. 11a, the thinned wafer 60 is separated from the handler wafer/substrate 16 and, with its device components becomes the third layer 63 of the three layer interconnected integrated circuit stack 5. After cleaning any residual wax or other bonding material 66 from the surface of the thinned wafer 60, an insulative layer 70, preferably silicon oxide, is deposited on the upper surface of the personalization level 64.

In the third integrated circuit level an interconnection will be made between the bond pad 26c and a wiring element 72 in the personalization layer 64. A first access opening 74 to the wiring element 72 is formed, using photolithographic patterning and anisotropic etching, similar to the process described for the access opening 34 supra and illustrated in FIG. 6a. Concurrently, a second access opening 76 to a second wiring element 78 in the personalization layer 64 is formed.

Figure 11B:
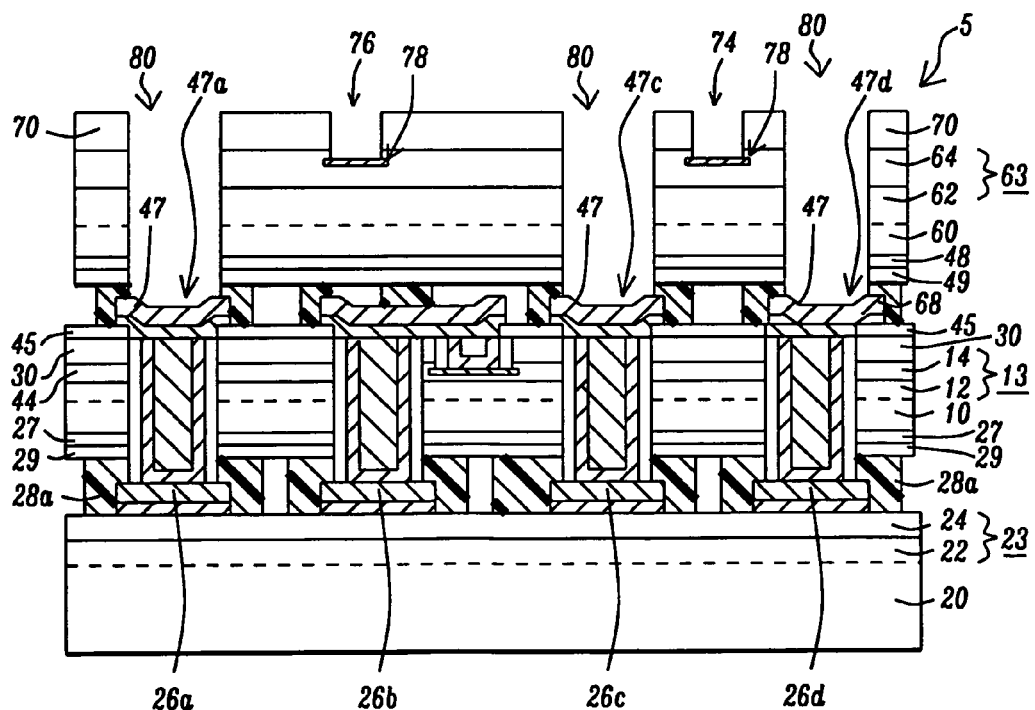

Referring next to FIG. 11b, deep pass-through openings 80 are formed, exposing the pads 47a, 47c, and 47d using photolithographic patterning and anisotropic etching, in the same manner as the processing described for forming the pass-through openings 39 supra and illustrated in FIG. 6b. The barrier layer 47 serves as an etch stop.

Figure 12:
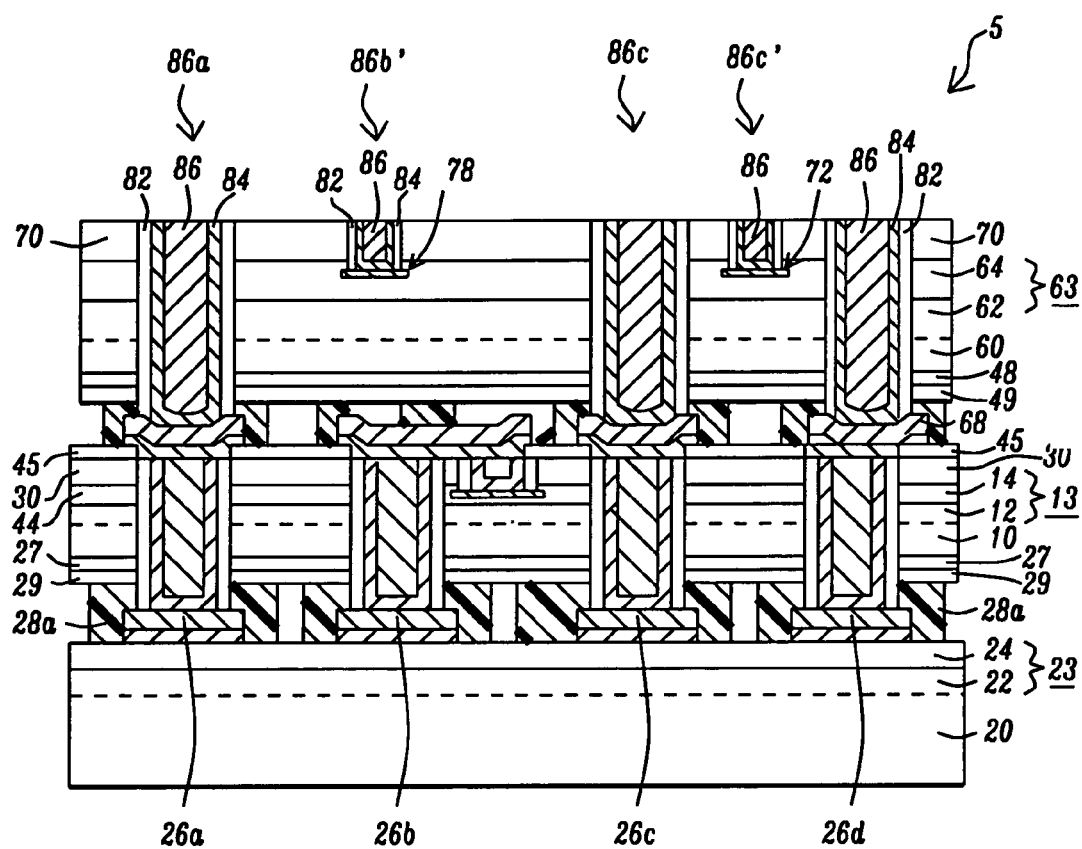
Figure 13:
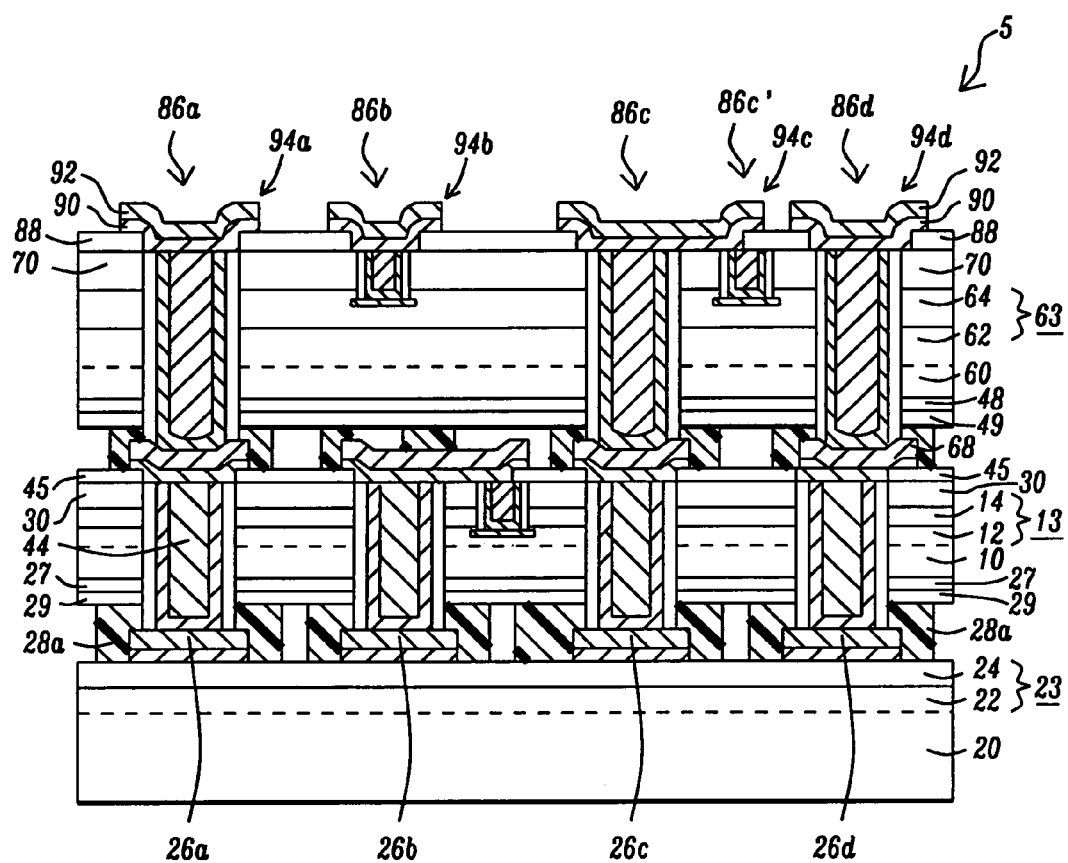

Referring next to FIG. 12, the formation of the conductive pass-through elements 86a, 86c, and 86d, and the wiring studs 86b' and 86c' is accomplished using the same procedure as that used to form the pass-through elements 44a, 44b, 44c, and 44d, and the wiring stud 44b' in the second integrated circuit layer.

After openings 80 are formed and any residual photoresist has been removed, a conformal layer of a sidewall insulator, preferably silicon oxide is deposited onto the insulative layer 70 and into the openings 74, 76, and 80, for example by PECVD. After deposition, the oxide layer is anisotropically etched to expose the bond pads 47a, 47c, and 47d at the base of each opening 80 and the wiring pads 72 and 78 while leaving oxide sidewalls 82 within each respective opening. A barrier layer 84 is next conformally deposited, preferably by sputtering, to a thickness of between about 10 and 300 nm. The barrier layer 84 may comprise Ta, TaN, Ti, Ta/TaN, Ti/TiN, or any conductive layer, which will block the migration of copper. A blanket seed layer (not shown), comprising a thin layer of copper or gold between about 500 and 3000 Å thick is next conformally deposited on the barrier layer 84, preferably by sputtering. A copper layer 86 is then deposited onto the seed layer preferably by ECD (electrochemical deposition), under conditions and procedures favoring uniform gap filling of high aspect ratio openings. These conditions and procedures include the use and control of brighteners and levelers in the plating bath as well as variation of plating rate by control of current density. The openings 74, 76 and 80 are thereby filled leaving a blanket layer of copper on the upper surface of the assembly 5. The final thickness of the copper layer is dependent upon the widths of the openings 74, 76, and 80. Alternately, the copper layer may be formed to the desired thickness entirely by sputtering or it may be deposited by a CVD method. However, because of the high aspect ratio of the openings 80, these methods present greater risk of voids in the resultant copper through-hole via.

The top surface of the assembly 5 is next planarized by CMP whereby the copper layer is polished down to a level to entirely remove the uppermost planar portions of the barrier layer 84 thereby forming and electrically isolating pass-through conductor elements 86a, 86c, 86d, and, wiring studs 86b' and 86c'. An over-polish period of the order of a few seconds to a minute is suggested to assure complete removal of any intervening conductive material.

An insulative cap layer 88 of silicon nitride or silicon carbide is deposited onto the layer 70 to provide a copper diffusion barrier as well as surface passivation. Access openings to the pass-through conductor elements 86a, 86c, and 86d and the wiring elements 86b' and 86c'. The region between pass-through element 86c and wiring element 86' may optionally be opened as well to form an interconnect channel therebetween. A blanket conductive barrier layer 90 is deposited over the assembly 5 preferably by sputtering, to a thickness of between about 10 and 300 nm. The barrier layer 90 may comprise Ta, TaN, Ti, Ta/TaN, Ti/TiN, or any similar conductive material, which will block the migration of copper. Next, a blanket conductive interconnect metal layer 92, for example aluminum or copper is sputtered onto the barrier layer 90 to a thickness of between about 0.5 and 1.0 microns. The combined layers 90 and 92 are then photolithographically patterned to form bond pads 94a, 94b, 94d, and a bond pad/lateral wiring segment 94c, which completes an interconnection between circuitry in integrated circuit layer 63 and circuitry in the non-adjacent integrated circuit layer 23. This completes the processing of the second integrated circuit layer. Alternately, the interconnections can also be formed by other known methods such as damascene or dual damascene processes as mentioned supra.

Second Embodiment

In a second embodiment of this invention a stack of three interconnected integrated circuit layers is formed consisting of two thin silicon integrated circuit layers formed on a third integrated circuit layer, the later being formed on a conventional silicon wafer substrate. The second embodiment is an alternative to the first embodiment supra and is identical to the first embodiment except that the blanket resin adhesive layer which is used to bind the thinned integrated circuit layers is not patterned after the layer is deposited. Instead, the entire adhesive layer is used to bond the integrated circuit layers together. Later, when the deep pass through openings are formed in the uppermost stacked integrated circuit layer the anisotropic etching process is extended to remove the resin layer at the base of the opening. The second embodiment is identical to the first embodiment up to the point where the handler mounted first wafer 10 has been thinned as illustrated in FIG. 2.

Figure 14:
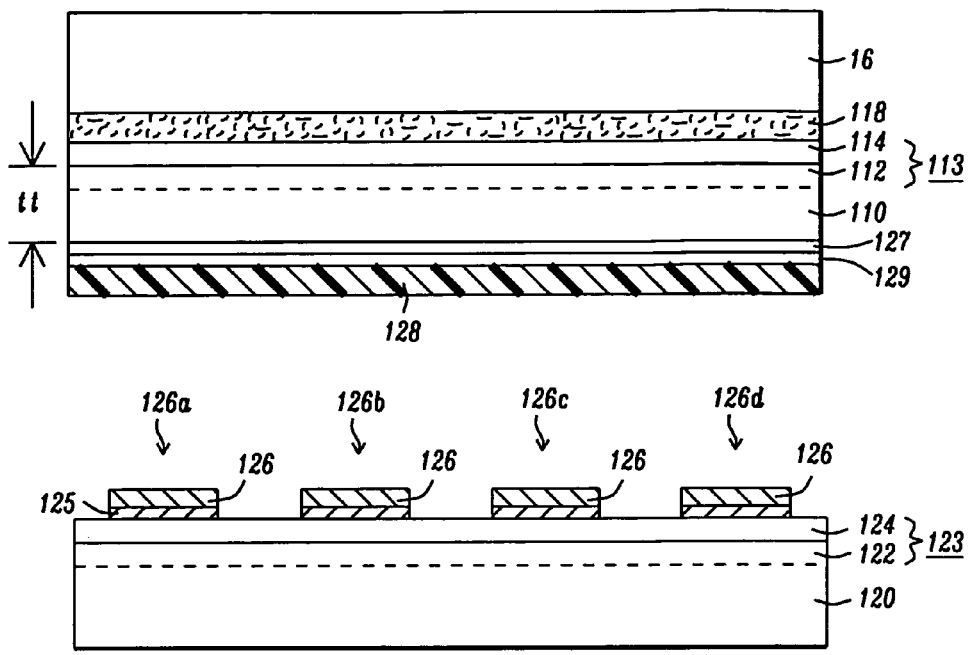
FIGS. 14 through 16 are cross sections of portions of semiconductor wafers illustrating alternate process steps which replace corresponding figures in the sequence shown by FIGS. 1 through 3 and FIGS. 5 through 13 for forming a multilayer stack of thin integrated circuit wafers according to the process of a second embodiment of this invention.

Referring now to FIG. 14, a first silicon wafer 110 is prepared by conventional processing. Semiconductive devices are formed within the top surface 112 of the wafer 110 and a personalization layer 114 consisting of a plurality of wiring levels interleaved with ILD layers and interconnected with conductive contacts and vias are formed over the devices. The wiring levels terminate in conductive bond pads, which will later be exposed through patterned access openings in a final top blanket passivation layer. The top passivation layer (not shown separately) also protects the subjacent wiring layers from damage during subsequent wafer thinning. Together, the device layer 112 and the personalization layer 114, which includes a top passivation layer (not shown), are herein defined as a second integrated circuit layer 113 of the three layer integrated circuit stack. In the process of this invention the wafer 110 is next fastened securely, by its upper surface, onto a handler substrate 16 with an easily removable bonding material 118 such as a wax or a soluble bonding agent or resin. The handler substrate 16 may consist of another silicon wafer or a manageable glass or sapphire plate. After mounting on the handler substrate 16, the first silicon wafer 110 is thinned to a thickness tt of between about 2 and 300 µm., preferably by grinding and polishing the underside of the wafer 110. After thinning, an insulative layer 127, preferably silicon oxide between about 500 and 1000 nm. thick and a barrier/passivation layer 129, preferably silicon nitride, between about 50 and 100 nm. thick are sequentially deposited on the underside of the wafer 110. The layers 127 and 129 together form an insulative shield layer which insulates and protects the silicon underside of the thinned wafer. The layer 129 is optional and may be applied if additional moisture or copper diffusion protection is needed.

A second silicon wafer 120, which will become the substrate or base of a to-be-formed integrated circuit layer stack, is processed like the first device wafer 110, forming devices (not shown) within its upper surface 122 and a personalization layer 124 consisting of a plurality of wiring levels interleaved with ILD layers and interconnected with conductive contacts and vias The wiring levels terminate in conductive bond pads 126a, 126b, 126c, and 126d which are exposed through openings patterned in a top passivation layer (not shown). Together, the device layer 122 and the personalization layer 124 are herein referred to as the first integrated circuit layer 123. The local wiring can be made of standard Aluminum or Copper back-end of the line process technology. In either case, the final metallization step involves protective passivation layer deposition and bond pad window opening.

The bond pads 126a, 126b, 126c, and 126d are formed by first depositing a barrier layer 125 on the upper dielectric layer of the personalization level 124. The barrier layer 125 may comprise Ta, TaN, Ti, Ta/TaN, Ti/TiN, or any other conductive layer which will block the migration of copper depending on the type of metallization scheme. The barrier layer 125 is typically deposited by sputter deposition and is between about 25 and 100 nm. thick A blanket layer of copper 126, between about 100 and 1000 nm. thick, is then formed on the barrier layer 125, preferably by sputter deposition. Alternately, the layer 126 may be formed of aluminum since the bond pads formed thereof will be the most remote from the final electrical contact pads and therefore will have a negligible effect on the overall performance of the completed integrated circuit. A second barrier layer (not shown) comparable in thickness to the first 125 may be deposited on the top of the copper layer 126. If the layer 126 is aluminum, the second barrier layer may be omitted.

The stack of blanket layers 125 and 126 are then patterned, preferably by photolithographically, to define bond pads 126a, 126b, 126c, and 126d. Alternately, a damascene or dual damascene process may be used to form the bond pads 126a, 126b, 126c, and 126d. The bond pads 126a, 126b, 126c, and 126d are preferably formed as circular disks. However, they may alternately be rectangular.

Bond pads 126a and 126d will be used in this embodiment to form a direct conductive path from devices in the first, lowermost, device layer 122 to the top of the stack. Bond pad 126b will participate in interconnection of circuitry in the first device layer 122 and to circuitry in the second device layer 112 while bond pad 126c will be connected to devices in a third device layer.

An insulative glue layer 128, preferably BCB, is coated on the polished underside of the now-thinned first silicon device wafer 110. Because the layer is not photolithographically patterned, the resin need not be photo sensitive as was the resin used in the first embodiment. While a Cyclotene resin is illustrated here as the preferential adhesive, alternative adhesives, for example, frit glasses, low-k materials, ceramics, or epoxies may be used. After soft baking to drive out residual solvents and achieve dimensional stability the resin layer 128 is partially cured and the bottom surface of the thinned wafer 110 is pressed onto the top surface of the base wafer 120 and the BCB is fully cured by placing the assembly into an annealing oven at a temperature of between about 250 and 450° C. in an ambient of Nitrogen for a period of between about 30 and 120 minutes thereby securely bonding the wafers together.

Figure 15:
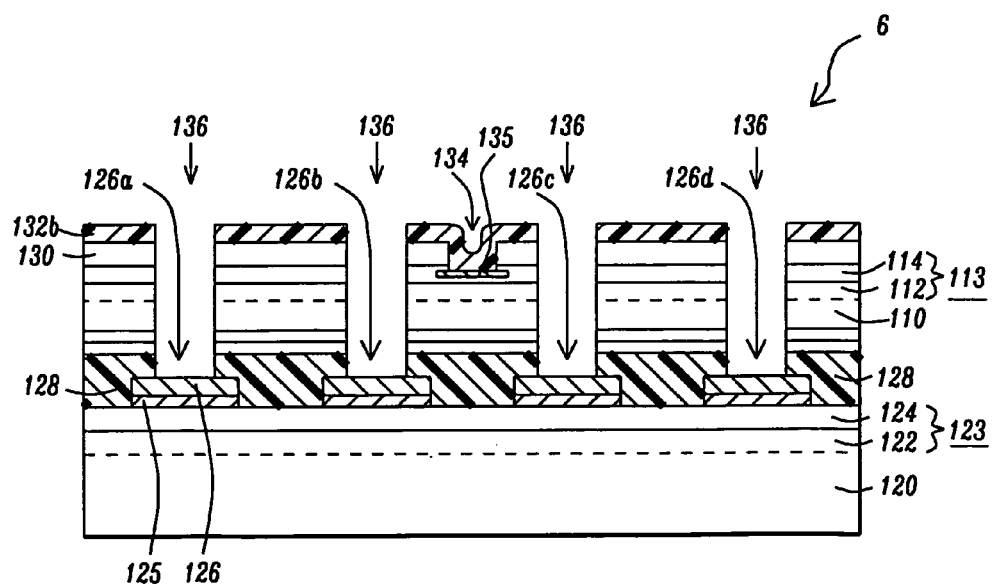

Referring next to FIG. 15, after bonding, the handler 16 is separated from the stack 6 on the substrate wafer 120. The thinned wafer 110 now becomes the second layer of an interconnected integrated circuit stack 6. After cleaning any residual wax or other bonding material 118 from the surface the stack 6, an insulative layer 130, preferably silicon oxide is deposited on the upper surface of the personalization layer 114 to a thickness of between about 3000 and 13,000 Å.

In the same manner as cited for layer 30 in the first embodiment, the Insulative layer 130 is first patterned to form an access opening 134 exposing the wiring element 135, and then masked with photoresist layer 132b to define the pass through openings 136. The pass through openings 136 are then etched anisotropically by RIE or plasma etching, first with an etchant containing fluorocarbons to penetrate the insulative layer 130 and the subjacent personalization layer 114 and then with an etchant containing halogens to penetrate the thinned silicon wafer 110, endpointing on the oxide layer 127 over each bond pad 126a, 126b, 126c, and 126d. The oxide layer 127 and the barrier layer 129 at the base of each opening 136 are then removed; preferably by an oxide RIE or plasma etch to expose resin layer 128. Finally, the anisotropic etching is continued, for example by using an etchant containing oxygen to penetrate the resin layer 128 and expose the subjacent bond pads 126a, 126b, 126c, and 126d. Care must be taken here to fully remove the resin in the opening while avoiding damage to the exposed bond pads, which could compromise the conductivity thereof. The widths of the completed openings 136 is preferably between about 2 and 80 microns depending on the application, the metallurgy, and the thickness of the thinned device wafer 110.

Figure 16:
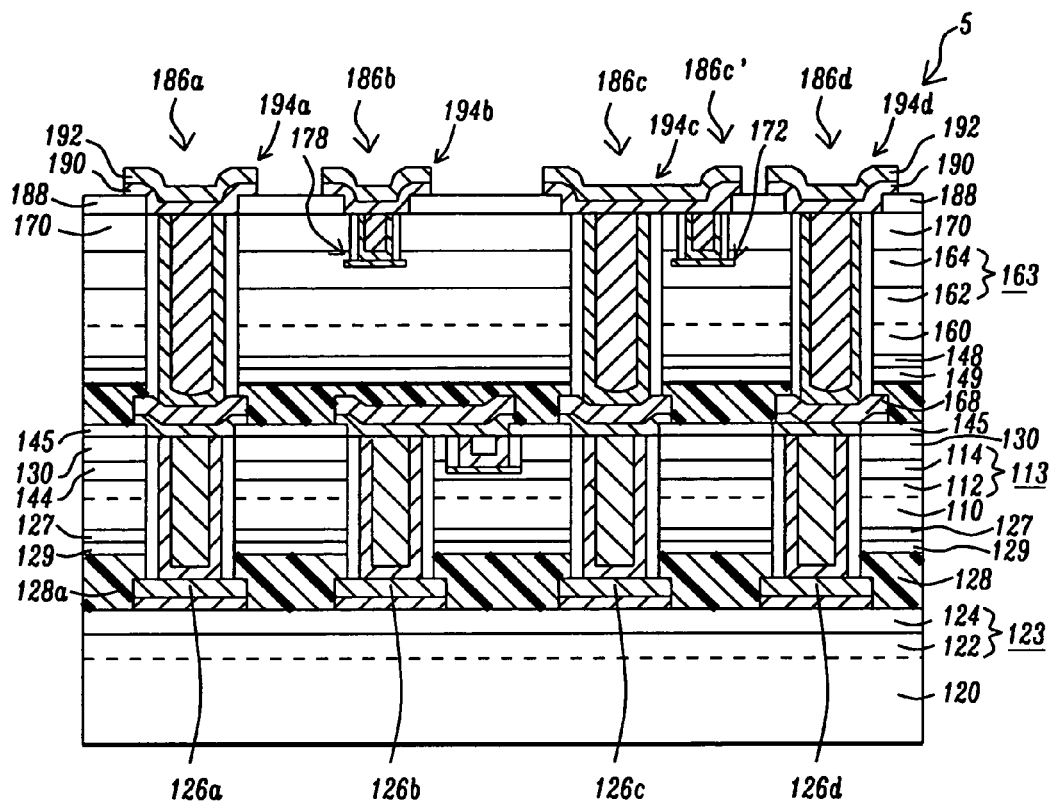

The final structure of the second embodiment is shown in FIG. 16. Processing of the stacked layer assembly 6 is continued to add the third integrated circuit layer 163 on the thinned wafer 160 in the manner of the first embodiment with the alternate processing just cited for the second embodiment, viz. the non-patterning of the resin layer 168 and the additional anisotropic etching step to penetrate the portions of the resin layer 168 at the base of the deep pass-through openings. The numerical designation 1xx of the features of the third integrated circuit layer correspond the xx designations of the third integrated circuit layer 63 of the first embodiment.

Additional integrated circuit layers may be added on the stack assembly 6 in the manner of those described in the embodiment. The three layer integrated circuit stack described in the embodiment illustrates that using the method of the invention, a plurality of integrated circuit layers may be formed on a base wafer and interconnections between any two or more layers can be made using the same set of process steps.

Advantages of the second embodiment over the first embodiment include 1) more uniform and greater strength of the bond because of greater surface area of the bonding resin, 2) critical alignment of the mounted wafer with the base wafer for bonding is eliminated since the resin openings are self-aligned with the pass-through, and 3) reduced void regions in the bond, and 4) elimination of the photolithographic steps to pattern the resin. Disadvantages include 1) critical etch step which, when using an etchant gas containing oxygen to penetrate the resin layer at the base of the pass-through opening without compromising the conductivity of the subjacent bond pad.

Third Embodiment

In a third embodiment of this invention a stack of two interconnected integrated circuit layers is formed by first bonding two silicon wafers and then thinning one of the two wafers, thereby eliminating the need for temporary bonding to a separate handler. The first wafer is a blank unprocessed wafer and the second wafer has an integrated circuit layer comprising a masterslice layer consisting of active and passive silicon devices and a personalization layer comprising wiring circuitry terminating in bond pads on a top passivation layer. In addition, the embodiment also illustrates how a multilayer integrated circuit package can be prepared for dicing during stack formation.

Figure 17:
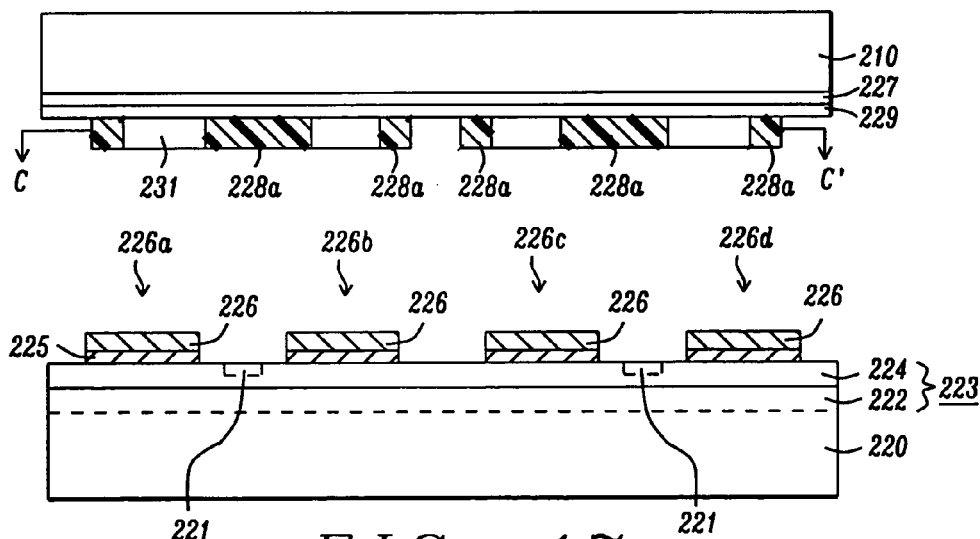
FIG. 17 is a cross sectional view of portions of two semiconductor wafers which are to be bonded and processed according to a third embodiment of this invention.

Referring to FIG. 17 a first un-processed blank silicon wafer 210, is provided. An insulative layer 227, preferably silicon oxide between about 500 and 1000 nm thick, and a barrier/passivation layer 229, preferably silicon nitride, between about 50 and 100 nm thick are sequentially deposited on the underside of the wafer 210. The layers 227 and 229 together form an insulative shield layer, which insulates and protects the silicon underside of the wafer 210. The layer 229 is optional and may be applied if additional moisture or copper diffusion protection is needed. A second wafer 220, which has A second silicon wafer 220, which will become the substrate or base of a to-be-formed integrated circuit layer stack, is processed to form devices (not shown) within its upper surface 222 and a personalization layer 224 consisting of a plurality of wiring levels interleaved with ILD layers and interconnected with conductive contacts and vias. The wiring levels terminate in conductive bond pads 226a, 226b, 226c, and 226d which are exposed through openings patterned in a top passivation layer (not shown). Alternately, a damascene or dual damascene process may be used to form the bond pads 226a, 226b, 226c, and 226d. The bond pads 226a, 226b, 226c, and 226d are preferably formed as circular disks. However, they may alternately be rectangular. Together, the device layer 222 and the personalization layer 224 are herein referred to as the first integrated circuit layer 223 of the integrated circuit layer stack. The dotted features 211 indicate the position of a dicing lane extending perpendicular to the cross section, where, in the final stages of processing, the wafer will be cut, preferably with a dicing saw, into rectangular integrated circuit dice or chips.

Figure 18:
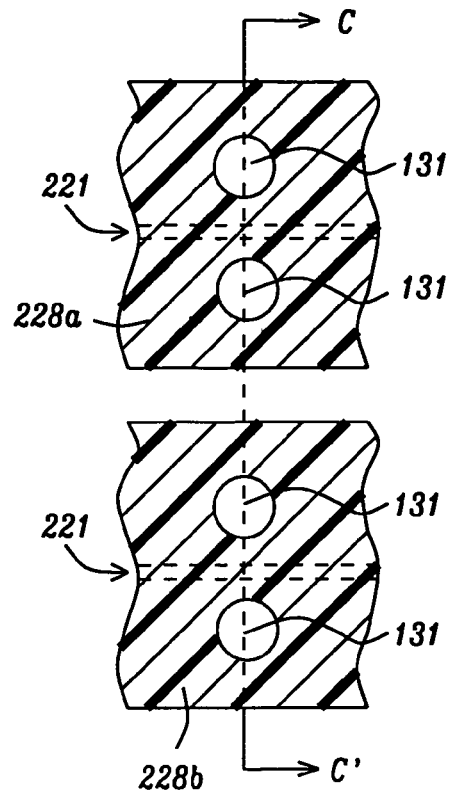
FIG. 18 is a planar view of a portion of a patterned glue layer used to bond two wafers according to a third embodiment of this invention.

An insulative glue layer 228, preferably a BCB resin, is coated on the surface of the nitride layer 229 of the first silicon wafer 210. While a Cyclotene resin is illustrated here as the preferential adhesive, alternative adhesives, for example, frit glasses, low-k materials, ceramics, or epoxies may be used. After soft baking to drive out residual solvents and achieve dimensional stability the resin layer 228 is partially cured and then patterned preferably by photolithography to form a pattern corresponding to that shown in planar view in FIG. 18. The openings 231 mate the device bond pad pattern of the second silicon device wafer 220 whereby, when the second device wafer 220 is bonded to the first wafer 210, each bond pad 226a, 226b, 226c, and 226d is encircled with adhesive resin. Dicing lanes 221 are also covered with the bonding resin. The wafer cross section C-C' of FIG. 16 is correspondingly shown on the planar view in FIG. 18.

Figure 19:
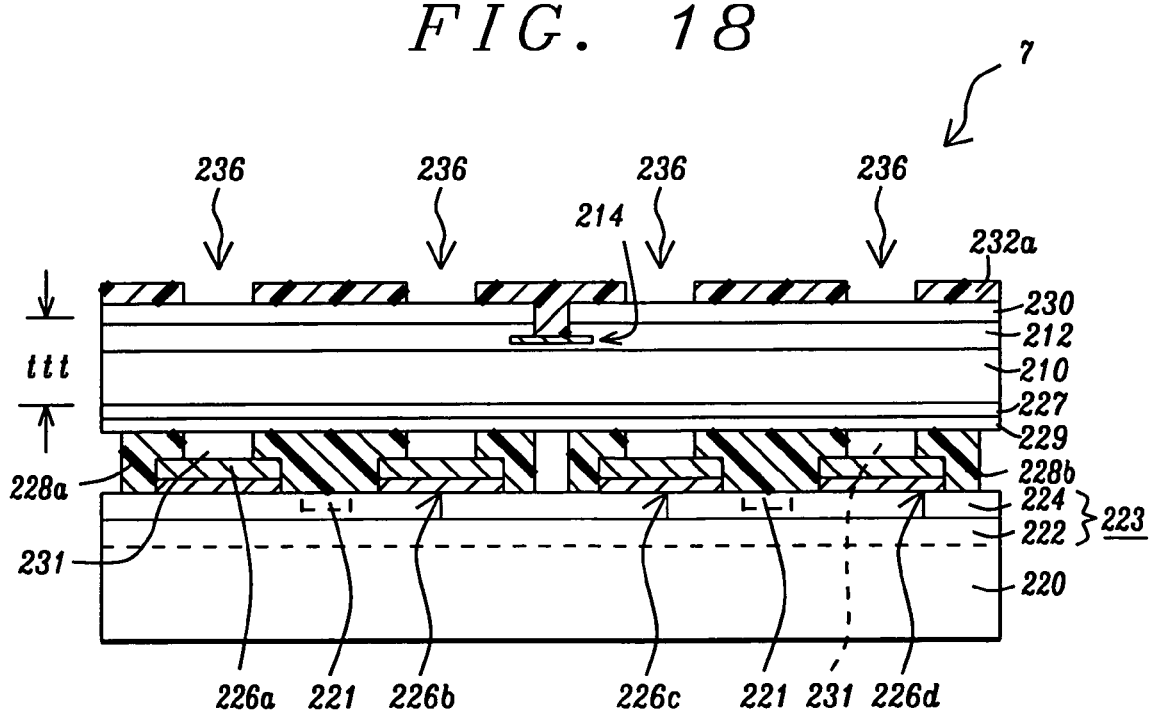
FIGS. 19 through 24 are cross sectional views of portions a substrate wafer showing the formation arid processing of a bonded integrated circuit layer stack according to a third embodiment of this invention.

After patterning, the first wafer 210 is positioned over the substrate wafer 220 so that openings in the BCB pattern are aligned to the respective bond pads 226a, 226b, 226c, and 226d. Referring to FIG. 19, the resin pattern 228a and 228b of the first wafer 210 is pressed onto the top surface of the base wafer 220 and the BCB features are fully cured by placing the assembly into an annealing oven at a temperature of between about 250 and 450° C. in an ambient of Nitrogen for a period of between about 30 and 120 minutes.

After bonding, the top surface of the first silicon wafer 210 is thinned to a thickness ttt of between about 2 and 300 μm., preferably by grinding and polishing using a CMP process. After thinning, devices (not shown) are formed in the thinned surface of the first silicon wafer 210, and a personalization layer 212 is formed having corresponding metal interconnections (not shown) which terminate in a bond pad site 214 on the top surface. Finally a passivation layer 230, for example of silicon oxide or silicon nitride or combination thereof is deposited to a thickness of between about 1000 to 1300 nm. The bond pad site 214 is then exposed in the same manner as described in the first embodiment.

It should be noted that the process steps for the formation of semiconductor devices and circuit wiring in and on the thinned surface of the top wafer, already bonded to the subjacent wafer, should take into account the thermal stability of the cured bonding adhesive 228. This applies particularly to the avoidance of high temperature furnace processing which would degrade the adhesive. Fortunately, most high temperature furnace processing has already been significantly replaced by rapid thermal processing (RTP) in present day processing. In addition, the shallow devices used today are more amenable to RTP and also require less process time. Nevertheless, these considerations should be taken into account in the selection of the bonding adhesive.

A photoresist layer 232a is then deposited over insulative layer 230 and then is photolithographically patterned to define form pass through openings 236 to the bond pads 226a, 226b, 226c, and 226d on the first integrated circuit level 223 and later to form access openings to the dicing lanes 221.

Figure 20:
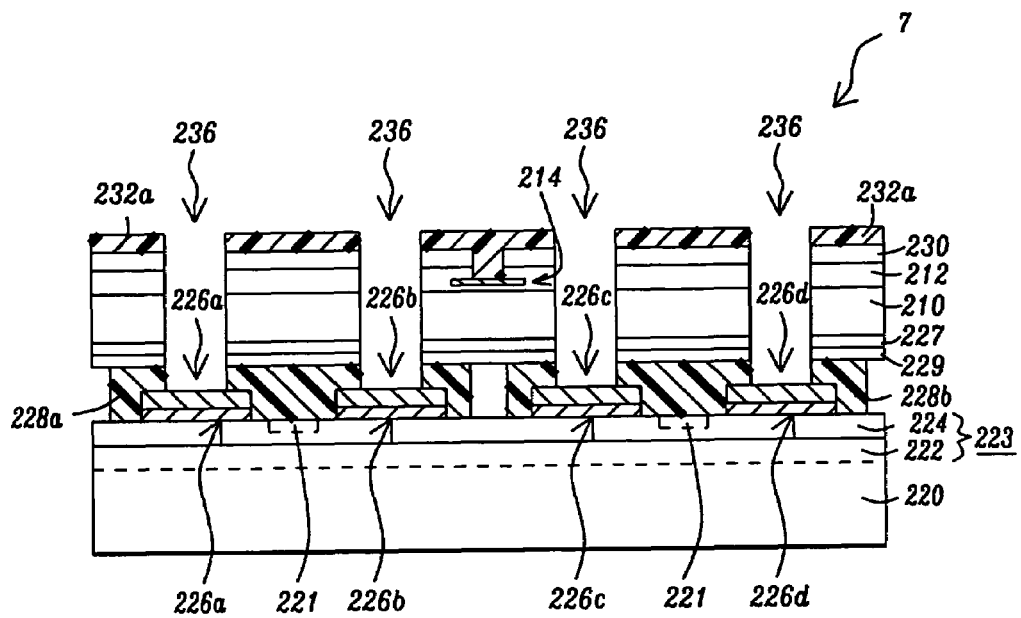

Referring now to FIG. 20, the pass through openings 236 are next formed by anisotropically etching using RIE or plasma etching, first with an etchant containing fluorocarbons to penetrate the insulative layer 230 and then with an etchant containing halogens to penetrate the thinned silicon wafer 210, endpointing on the oxide layer 227 over each bond pad 226a, 226b, 226c, and 226d. The oxide layer 227 and the barrier layer 229 at the base of each opening 236 are then removed; preferably by an oxide RIE or plasma etch to expose the subjacent bonding pads. The widths of the completed openings 236 is preferably between about 2 and 80 microns depending on the application, the metallurgy, and the thickness of the thinned device wafer 210.

Figure 21:
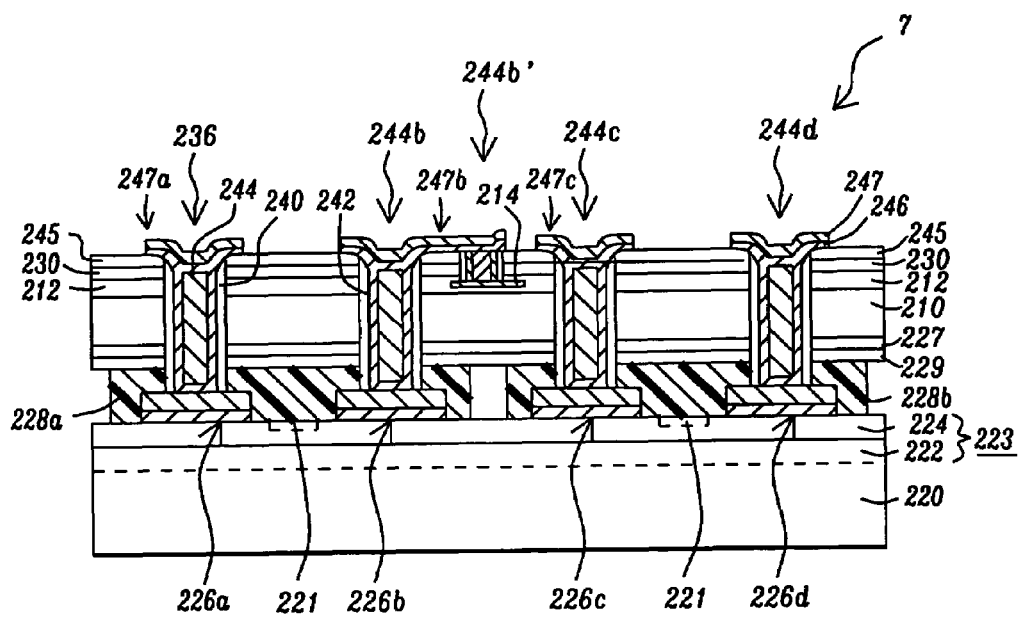

Referring next to FIG. 21, residual photoresist mask 232a is removed, preferably with a liquid stripper, and a conformal layer of a sidewall insulator, preferably silicon oxide is deposited, for example by PECVD and anisotropically etched, exposing the wiring element 214 and the bond pads 226a, 226b, 226c, and 226d at the base of each opening 236 while leaving oxide sidewalls 240 within each deep opening 236 and over the wiring element 214. A barrier layer 242 is next conformally deposited, preferably by sputtering, to a thickness of between about 10 and 300 nm. The barrier layer 242 may comprise Ta, TaN, Ti, Ta/TaN, Ti/TiN, or any conductive layer which will block the migration of copper. A blanket seed layer (not shown), comprising a thin layer of copper or gold between about 500 and 3000 Å thick is next conformally deposited on the barrier layer 242, preferably by sputtering. A copper layer 244 is then deposited onto the seed layer preferably by ECD (electrochemical deposition), under conditions and procedures favoring uniform gap filling of high aspect ratio openings. These conditions and procedures include the use and control of brighteners and levelers in the plating bath as well as variation of plating rate by control of current density. The openings 236 are thereby filled leaving a blanket layer of copper on the upper surface. The final thickness of the copper is dependent upon the widths of the openings 236. Alternately, the layer 244 may be formed to the desired thickness entirely by sputtering or it may be deposited by a CVD method. However, because of the relatively high aspect ratio of the openings 239, these methods present greater risk of voids in the resultant copper through-hole via. The top surface of the assembly 7 is planarized by CMP whereby the copper layer 244 is polished to a level to remove the uppermost planar portions of the barrier layer 242 to form and electrically isolate pass-through conductor elements 244a, 244b, 244c, and 244d. An over-etch period of the order of a few seconds to a minute is suggested to assure complete removal of any intervening conductive material.

Top bond pads 247a, 247b, 247c, and 247d are next patterned on tops of the pass-through conductor elements 244a, 244b, 244c, and 244d. The bond pad 247b includes a lateral tab which connects the wiring element 214 to wiring in the subjacent integrated circuit layer 223. An insulative cap layer 245 of silicon nitride or silicon carbide is deposited onto the layer 230 to provide a copper diffusion barrier as well as surface passivation. Access openings to the pass-through conductor elements 244a, 244b, 244c, and 244d, the conductive stud 244b', and other bond pads (not shown) for the circuit layer on the bonded wafer 210, are next patterned in cap layer 245. A blanket conductive barrier layer 246 is deposited over the assembly 7 preferably by sputtering, to a thickness of between about 10 and 300 nm. The barrier layer 246 may comprise Ta, TaN, Ti, Ta/TaN, Ti/TiN, or any similar conductive material which will block the migration of copper. Next, a blanket conductive interconnect metal layer 247, for example aluminum or copper is sputtered onto the barrier layer 246 to a thickness of between about 0.5 and 1.0 microns. The combined layers 246 and 247 are then patterned to form bond pads 247a, 247b, 247c, and 247d. Alternately, the pass-through conductor elements 244a, 244b, 244c, and 244d interconnection can be formed by other known methods such as damascene or dual damascene processes as mentioned supra.

Figure 22:
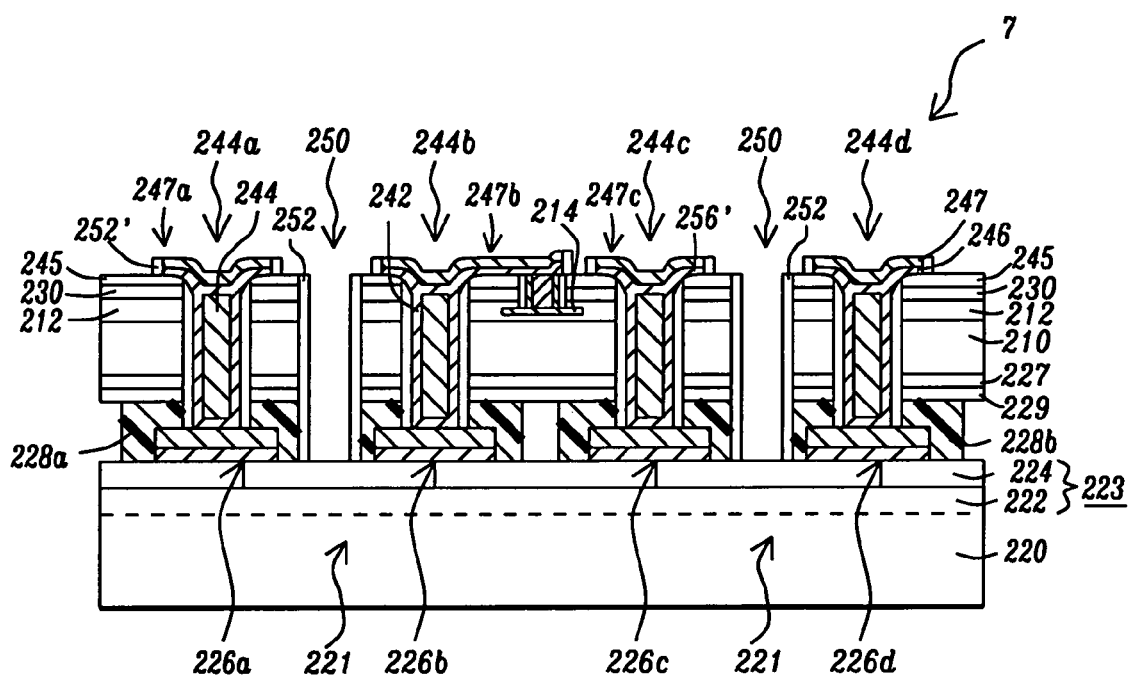

Referring now to FIG. 22, deep trenches 250 are photolithographically patterned and anisotropically etched over the dicing lanes 221. The trenches 250 are preferably etched through the personalization layer 224 stopping on the silicon surface of the base wafer 220. Sidewalls 252 are then formed within the trenches 250 using well known sidewall processing. In the present embodiment, the sidewalls are formed by successively depositing first a conformal silicon oxide layer between about 500 and 1000 nm. thick and next a conformal silicon nitride layer between about 50 and 1000 nm. thick on the stack assembly 7. Anisotropic etching then defines the sidewalls in the openings 250 as well as short sidewalls on the edges of the bond pads 247a, 247b, 247c, and 247d.

The third embodiment illustrates the formation of dicing lane trenches in a bonded wafer stack wherein the top wafer is first bonded to the bottom wafer and then thinned. It should be understood that dicing lane trenches may also be formed in a bonded wafer stack formed by the method of either the first or second embodiment, wherein the top wafer is thinned before bonding. The forming of dicing lane trenches is particularly well suited to wafer stacks formed by the method of the second embodiment which uses an un-patterned resin glue layer.

Figure 23:
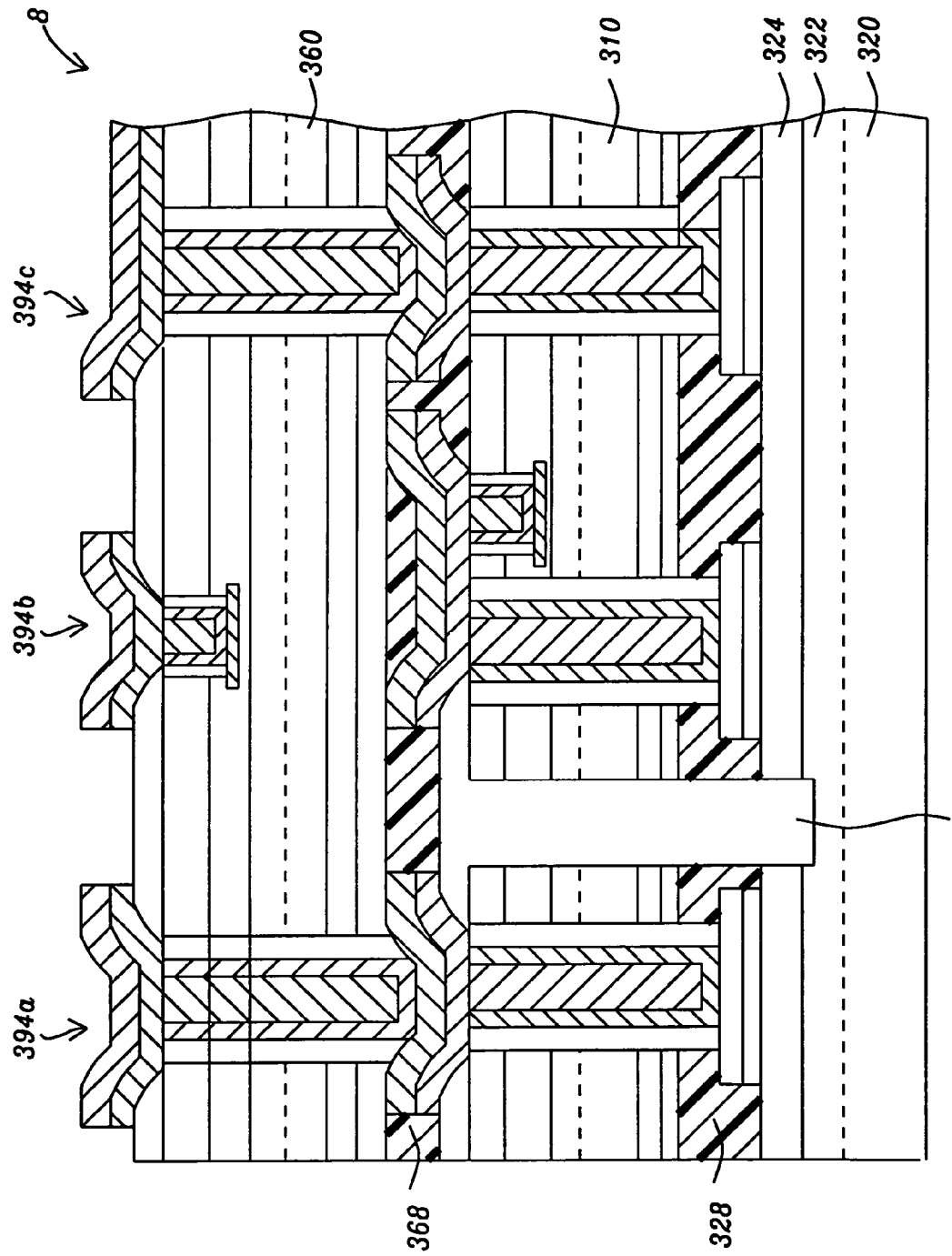
Figure 24:
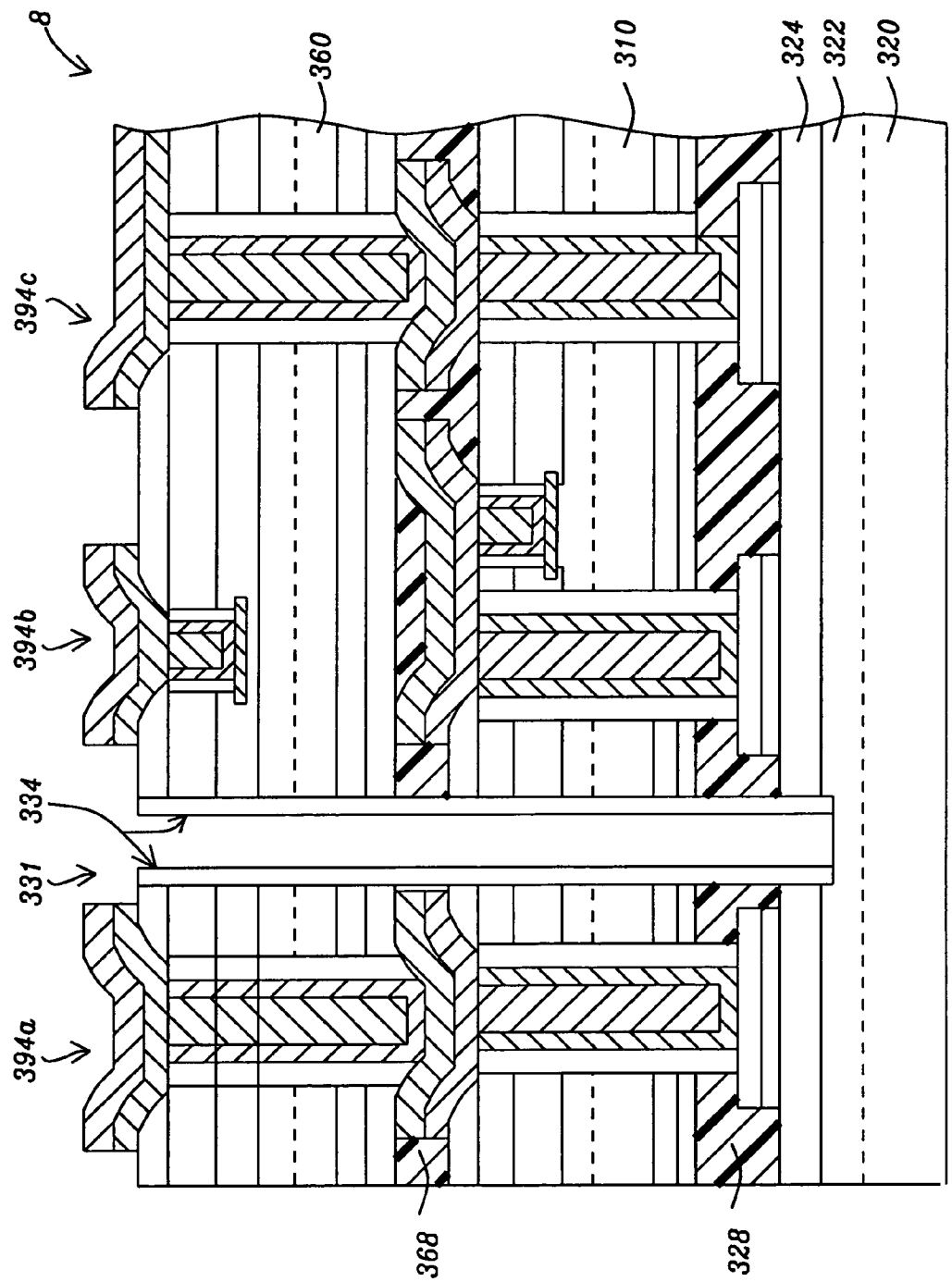

The formation of trenches over dicing lanes in a multi device layer stack is illustrated in FIGS. 23 and 24 which are representations of the completed structure (FIG. 16) of the first embodiment. In FIG. 23 there is shown a dicing lane trench 331 which was formed through the thinned wafer layer 310 terminating at or slightly within the masterslice level 322 of the base wafer 320 in the manner described supra to achieve the configuration illustrated in FIG. 22 with the notable exception that the sidewall was omitted. The second thinned wafer layer 360 was then bonded to the top of the stack 8 with the bonding adhesive 368. The stack 8 is then processed to the point wherein the bond pads 394a, 394b, and 394c are completed.

Then, preferably using a photolithography, the thinner wafer layer 360 is penetrated by anisotropic etching to extend the dicing lane trench 331 as illustrated in FIG. 24. In this embodiment the layer 360 is the uppermost layer of the stack 8. The extended trench 331 is now lined with a protective sidewall 334. In the present embodiment the protective sidewall 334 is formed by successively depositing first, a conformal silicon oxide layer, between about 500 and 1000 nm. Thick, and next a conformal silicon nitride layer, between about 50 and 1000 nm. thick, on the stack assembly 8 followed by anisotropic etching. The sidewall 334 forms a hermetic seal which protects the edge regions of the bonding adhesive 368, and 328, from contamination after the dice are cut apart in the dicing operation. While the present embodiment uses a sidewall of silicon nitride on silicon oxide, many other materials could be used to form the protective covering, for example metals such as titanium or tungsten either directly on the inner trench wall or electrically isolated from the trench wall with an insulative layer of silicon oxide.

In the embodiments of this invention, a copper metallurgy is used to form the deep pass-through interconnects in the various integrated circuit layers. It should be understood that any metallurgies which are good electrical conductors and can be electrodeposited, such as copper, gold, or nickel or a combination thereof may be used to form the deep pass-throughs integrated stack without departing from the spirit and scope of the invention. Electrodeposited metals are preferred because of the ability to conformally deposit them into high aspect ratio openings without the formation of voids.

While this invention has been particularly shown and described with reference to the preferred embodiments thereof, it will be understood by those skilled in the art that various changes in form and details may be made without departing from the spirit and scope of the invention.

What is claimed is:

1. A method for forming an integrated device layer stack comprising:
    (a) providing a first device wafer having an underside;
    (b) providing a base device wafer having an exposed array of at least one bond pad;
    (c) thinning said first device wafer to a thickness by planar polishing said underside, thereby forming a first device layer;
    (d) forming a blanket insulative shield layer on said underside;
    (e) patterning a non-conductive adhesive layer on said shield layer to form an array of at least one closed loop adhesive band placed in an arrangement mirroring said array of at least one bond pad whereby each one of said at least one of bond pad is provided with a corresponding perimetrically mating closed loop adhesive band;
    (f) positioning said array of at least one closed loop adhesive band over and facing said array of at least one bond pad and, while aligning said thinned first device wafer to said base device wafer, pressing said first and said base wafers together, thereby forming a device layer stack;
    (g) curing said non-conductive adhesive layer thereby forming a bond;
    (h) patterning and anisotropically etching first device layer and said shield layer to form at least one opening exposing a subjacent bond pad;
    (i) forming insulative sidewalls within each said opening; and
    (j) forming a conductive pass-through element in each said opening.

2. The method of claim 1 further comprising:
    (a) after step (j) of claim 1, forming a bond pad on at least one said pass-through element;
    (b) providing a second device wafer having a second underside;
    (c) thinning said second device wafer to a thickness by planar polishing said second underside, thereby forming a second device layer; and
    (d) repeating steps (d) through (k) of claim 1 thereby adding a second device layer to said device layer stack.

3. The method of claim 1 wherein said first device wafer is mounted on a handler during said planar polishing using a sacrificial bonding agent comprising a wax or a soluble resin.

4. The method of claim 1 wherein said thinning is accomplished by chemical mechanical polishing.

5. The method of claim 1 wherein said thickness is between about 2 and 300 μm.

6. The method of claim 1 wherein said insulative shield layer comprises a silicon oxide layer between about 500 and 1000 nm. thick and a silicon nitride layer between about 50 and 100 nm. thick.

7. The method of claim 1 wherein said first insulative layer is silicon oxide.

8. The method of claim 1 wherein said non-conductive adhesive layer comprises a resin containing benzocyclobutene, a frit glass, a ceramic, or an epoxy.

9. The method of claim 1 wherein said curing of said non-conductive adhesive layer is accomplished at a temperature of between about 250 and 450° C.

10. The method of claim 1 wherein said conductive pass-through is copper.

11. The method of claim 10 wherein said copper is deposited by electrochemical deposition onto a pre-deposited seed layer which in turn is deposited onto a conformal barrier layer.

12. The method of claim 11 wherein said barrier layer comprises Ta, TaN, Ti, Ta/TaN, or Ti/TiN.

13. The method of claim 1 wherein said conductive pass-through is nickel or gold or any metal that can be electrodeposited.

14. The method of claim 1 further comprising:
    (a) defining a pattern of dicing lanes on said first wafer wherein said non-conductive adhesive layer is continuous, overlies and extends beyond the boundaries of said dicing lanes;
    (b) after step (j) of claim 1, patterning vertical trenches along said dicing lanes, said trenches extending at least into said base device wafer, thereby penetrating and extending beyond said non-conductive adhesive layer; and (c) forming protective sidewalls in said trenches, thereby providing a protective seal over portions of said non-conductive adhesive layer exposed in said trenches.

15. The method of claim 14 wherein said protective sidewalls comprise a layer of silicon nitride overlying a layer of silicon oxide, a metal layer, or a metal layer overlying an insulative layer.

16. A method for forming an integrated device layer stack with an interlevel interconnect comprising:
   (a) providing a first device wafer having an underside;
   (b) providing a base device wafer having an array of at least one exposed bond pad;
   (c) thinning said first device wafer to a thickness by planar polishing said underside, thereby forming a first device layer;
   (d) forming a blanket insulative shield layer on said underside;
   (e) patterning a non-conductive adhesive layer on said shield layer to form an array of at least one closed loop adhesive band placed in an arrangement mirroring said array of at least one bond pad whereby each one of said at least one of bond pad is provided with a corresponding perimetrically mating closed loop adhesive band;
   (f) positioning said array of at least one closed loop adhesive band over and facing said array of at least one bond pad and, while aligning said thinned first device wafer to said base device wafer, pressing said first and said base wafers together, thereby forming a device layer stack;
   (g) curing said non-conductive adhesive layer thereby forming a bond;
   (h) patterning and anisotropically etching said first device layer to form at least one access opening to a wiring element therein;
   (i) patterning and anisotropically etching said first device layer and subjacent shield layer to form at least one pass-through opening exposing a bond pad on said base device wafer;
   (j) forming insulative sidewalls within each access opening and each pass-through opening; and
   (k) forming a conductive pass-through element in each said pass-through opening and a conductive plug in each said access opening; and
   (l) depositing and patterning a second conductive layer on said device layer stack to form an interconnect between at least one pass-through element and at least one conductive plug.

17. The method of claim 16 wherein said first device wafer is mounted on a handler during said planar polishing using a sacrificial bonding agent comprising a wax or a soluble resin.

18. The method of claim 16 wherein said thinning is accomplished by chemical mechanical polishing.

19. The method of claim 16 wherein said thickness is between about 2 and 300 µm.

20. The method of claim 16 wherein said insulative shield layer comprises a silicon oxide layer between about 500 and 1000 nm. thick and a silicon nitride layer between about 50 and 100 nm. thick.

21. The method of claim 16 wherein said first insulative layer is silicon oxide.

22. The method of claim 16 wherein said non-conductive adhesive layer comprises a resin containing benzocyclobutene, a frit glass, a ceramic, or an epoxy.

23. The method of claim 16 wherein said non-conductive adhesive layer is accomplished cured at a temperature of between about 250 and 450° C.

24. The method of claim 16 wherein said conductive pass-through is copper.

25. The method of claim 24 wherein said copper is deposited by electrochemical deposition onto a pre-deposited seed layer which in turn is deposited onto a conformal barrier layer.

26. The method of claim 25 wherein said barrier layer comprises Ta, TaN, Ti, Ta/TaN, or Ti/TiN.

27. A method for forming a device layer stack on a base device wafer comprising:
   (a) providing a first device wafer having an underside;
   (b) providing a base device wafer having an exposed array of at least one bond pad;
   (c) thinning said first device wafer to a thickness by planar polishing said underside, thereby forming a first device layer;
   (d) forming a blanket insulative shield layer on said underside;
   (e) applying a blanket non-conductive adhesive layer on said shield layer;
   (f) positioning the first device wafer with the non-conductive adhesive layer over and facing the array of at least one bond pad and, while aligning the first device wafer to the base device wafer, pressing the first and the base wafers together, thereby forming a device layer stack;
   (g) curing said non-conductive adhesive layer thereby forming a bond;
   (h) patterning and anisotropically etching said first device layer, said shield layer, and said non-conductive adhesive layer to form at least one opening exposing a subjacent bond pad;
   (i) forming insulative sidewalls within each said opening; and
   (j) forming a conductive pass-through element in each said opening.

28. The method of claim 27 further comprising:
   (a) after step (j) of claim 27 forming a bond pad on at least one said pass-through element;
   (b) providing a second device wafer having a second underside;
   (c) thinning said second device wafer to a thickness by planar polishing said second underside, thereby forming a second device layer; and
   (d) repeating steps (d) through (j) of claim 27 thereby adding a second device layer to said device layer stack.

29. The method of claim 27 wherein said first device wafer is mounted on a handler during said planar polishing using a sacrificial bonding agent comprising a wax or a soluble resin.

30. The method of claim 27 wherein said thinning is accomplished by chemical mechanical polishing.

31. The method of claim 27 wherein said thickness is between about 2 and 300 µm.

32. The method of claim 27 wherein said insulative shield layer comprises a silicon oxide layer between about 500 and 1000 nm. thick and a silicon nitride layer between about 50 and 100 nm. thick.

33. The method of claim 27 wherein said first insulative layer is silicon oxide.

34. The method of claim 27 wherein said non-conductive adhesive layer comprises a resin containing benzocyclobutene, a frit glass, a ceramic, or an epoxy.

35. The method of claim 27 wherein said nonconductive adhesive layer is cured at a temperature of between about 250 and 450° C.

36. The method of claim 27 wherein said conductive pass-through is copper.

37. The method of claim 36 wherein said copper is deposited by electrochemical deposition onto a pre-deposited seed layer which in turn is deposited onto a conformal barrier layer.

38. The method of claim 37 wherein said barrier layer comprises Ta, TaN, Ti, Ta/TaN, or Ti/TiN.

39. The method of claim 27 further comprising:
   (a) defining a pattern of dicing lanes on said first wafer wherein said non-conductive adhesive layer is continuous, overlies and extends beyond the boundaries of said dicing lanes;
   (b) after step (j) of claim 27, patterning vertical trenches along said dicing lanes, said trenches extending at least into said base device wafer, thereby penetrating and extending beyond said non-conductive adhesive layer; and
   (c) forming protective sidewalls in said trenches, thereby providing a protective seal over portions of said non-conductive adhesive layer exposed in said trenches.

40. The method of claim 39 wherein said protective sidewalls comprise a layer of silicon nitride overlying a layer of silicon oxide, a metal layer, or a metal layer overlying an insulative layer.

41. A method for forming an integrated device layer stack comprising:
   (a) providing a first wafer having an underside;
   (b) forming a blanket insulative shield layer on said underside;
   (c) providing a base device wafer having an exposed array of at least one bond pad;
   (d) patterning a non-conductive adhesive layer on said shield layer to form an array of at least one closed loop adhesive band placed in an arrangement mirroring said array of at least one bond pad whereby each one of said at least one of bond pad is provided with a corresponding perimetrically mating closed loop adhesive band;
   (e) positioning said array of at least one closed loop adhesive band over and facing said array of at least one bond pad and, while aligning said first wafer to said base device wafer, pressing said first and said base wafers together, thereby forming a device layer stack;
   (f) curing said nonconductive adhesive layer thereby forming a bond;
   (g) thinning said first wafer to a thickness by planar polishing, thereby forming a thin layer;
   (h) forming a device on said thin layer;
   (i) patterning and anisotropically etching said thin layer and said shield layer to form at least one opening exposing a subjacent bond pad;
   (j) forming insulative sidewalls within each of said at least one opening; and
   (k) forming a conductive pass-through element in each of said at least one opening.

\* \* \* \* \*